US011996443B2

(12) United States Patent
Lim et al.

(10) Patent No.: US 11,996,443 B2
(45) Date of Patent: May 28, 2024

(54) SEMICONDUCTOR DEVICE INCLUDING BARRIER LAYER BETWEEN ACTIVE REGION AND SEMICONDUCTOR LAYER AND METHOD OF FORMING THE SAME

(71) Applicant: SAMSUNG ELECTRONICS CO., LTD., Suwon-si (KR)

(72) Inventors: Sungkeun Lim, Suwon-si (KR); Unki Kim, Suwon-si (KR); Yuyeong Jo, Suwon-si (KR); Yihwan Kim, Suwon-si (KR); Jinbum Kim, Suwon-si (KR); Pankwi Park, Suwon-si (KR); Ilgyou Shin, Suwon-si (KR); Seunghun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/729,676

(22) Filed: Apr. 26, 2022

(65) Prior Publication Data

US 2022/0254878 A1 Aug. 11, 2022

Related U.S. Application Data

(63) Continuation of application No. 16/821,565, filed on Mar. 17, 2020, now Pat. No. 11,322,583.

(30) Foreign Application Priority Data

May 24, 2019 (KR) ........................ 10-2019-0061466

(51) Int. Cl.

| | |
|---|---|
| ***H01L 29/06*** | (2006.01) |
| ***H01L 21/02*** | (2006.01) |
| ***H01L 29/66*** | (2006.01) |
| ***H01L 29/78*** | (2006.01) |

(52) U.S. Cl.

CPC ...... *H01L 29/0638* (2013.01); *H01L 21/0245* (2013.01); *H01L 29/66545* (2013.01); *H01L 29/66795* (2013.01); *H01L 29/785* (2013.01)

(58) Field of Classification Search

CPC ............. H01L 29/0638; H01L 21/0245; H01L 29/66545; H01L 29/66795; H01L 29/785; H01L 29/42392; H01L 29/78696; H01L 29/0649; H01L 29/66742; H01L 29/78606; H01L 29/78651; H01L 29/7827; H01L 21/823418; H01L 21/823493; H01L 29/7843; H01L 29/7846; H01L 29/7848

See application file for complete search history.

(56) References Cited

U.S. PATENT DOCUMENTS

| | | | |
|---|---|---|---|
| 9,318,573 | B2 | 4/2016 | Moon et al. |
| 9,899,273 | B1 | 2/2018 | Wang et al. |
| 9,899,517 | B2 | 2/2018 | Yu et al. |
| 10,074,718 | B2 | 9/2018 | Dewey et al. |
| 10,186,580 | B2 | 1/2019 | Rachmady et al. |

(Continued)

*Primary Examiner* — Cuong B Nguyen
(74) *Attorney, Agent, or Firm* — Fish & Richardson P.C.

(57) ABSTRACT

A semiconductor device includes; an active region; an isolation region defining the active region; a barrier layer on the active region; an upper semiconductor layer on the barrier layer; and a gate structure covering an upper surface, a lower surface, and side surfaces of the upper semiconductor layer in a first direction. The first direction is a direction parallel to an upper surface of the active region, and the barrier layer is disposed between the gate structure and the active region.

17 Claims, 23 Drawing Sheets

(56) References Cited

U.S. PATENT DOCUMENTS

| | | | | |
|---|---|---|---|---|
| 2007/0155142 | A1* | 7/2007 | Jin | H01L 29/66795<br>257/E29.085 |
| 2011/0124161 | A1 | 5/2011 | Ernst et al. | |
| 2015/0014487 | A1 | 5/2015 | Mears et al. | |
| 2015/0144878 | A1 | 5/2015 | Mears et al. | |
| 2017/0047416 | A1 | 2/2017 | Cappellani et al. | |
| 2017/0317168 | A1 | 11/2017 | Chent et al. | |
| 2018/0026909 | A1 | 9/2018 | Chuang et al. | |
| 2018/0269099 | A1 | 9/2018 | Chuang et al. | |
| 2020/0044087 | A1* | 2/2020 | Guha | H01L 29/66439 |

* cited by examiner 1
93(93_1)
93(93_2)
90
83g
71(71_1)
71(71_2)
33S2
50U
A
65
83
85
87
42c
38c
34c
33
30c
16
50b
10
5
I
I'
Z
X
Y
33S1
30S1
50S
52
50a
16S1
II
II'

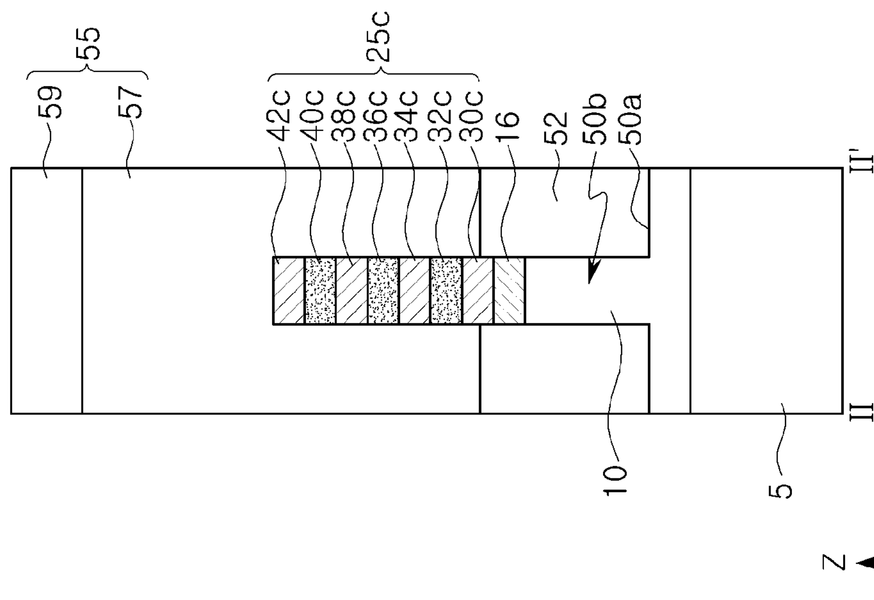
FIG. 17
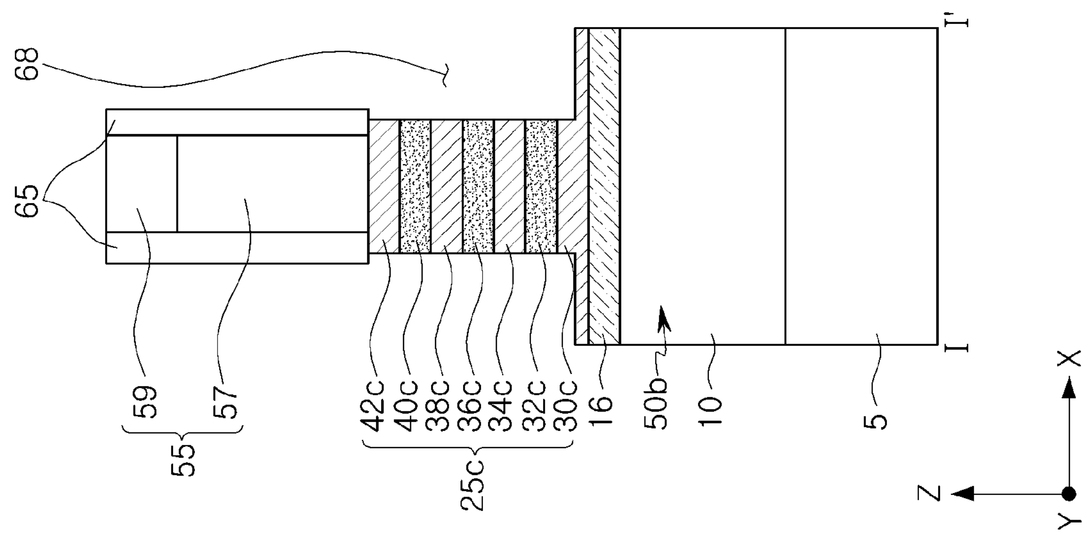

SEMICONDUCTOR DEVICE INCLUDING BARRIER LAYER BETWEEN ACTIVE REGION AND SEMICONDUCTOR LAYER AND METHOD OF FORMING THE SAME

CROSS-REFERENCE TO RELATED APPLICATION

This is a Continuation of U.S. application Ser. No. 16/821,565, filed Mar. 17, 2020, and a claim of priority under 35 U.S.C. § 119 is made to Korean Patent Application No. 10-2019-0061466 filed on May 24, 2019, the subject matter of which is hereby incorporated by reference.

BACKGROUND

1. Field

Embodiments of the inventive concept relate to semiconductor devices. More particularly, embodiments of the inventive concept relate to semiconductor devices including a barrier layer between an active region and a semiconductor layer. Other embodiments of the inventive concept relate to methods of fabricating semiconductor devices.

2. Description of Related Art

As demand for high performance, high speed, and/or multifunctionalization of semiconductor devices has increased, the integration density of semiconductor devices has increased accordingly. Greater integration density motivates reduction in the overall size of a planar Metal-Oxide Semiconductor Field-Effect Transistor (MOSFET) devices. In order to overcome certain limitations associated with the size reductions in MOSFET devices, design and fabrication efforts are ongoing to develop a MOSFET including a channel having a three-dimensional structure.

SUMMARY

In one aspect the inventive concept provides a semiconductor device having improved integration density. In another aspect the inventive concept provides a semiconductor device having improved overall functionality. In still another aspect the inventive concept provides a method of fabricating a semiconductor device with improved productivity.

According to an aspect of the inventive concept, a semiconductor device includes; an active region; an isolation region defining the active region; a barrier layer on the active region; an upper semiconductor layer on the barrier layer; and a gate structure covering an upper surface, a lower surface, and side surfaces of the upper semiconductor layer in a first direction. The first direction is a direction parallel to an upper surface of the active region, and the barrier layer is disposed between the gate structure and the active region.

According to another aspect of the inventive concept, a semiconductor device includes; an isolation region disposed on a substrate and defining an active region; a barrier layer on the active region; a plurality of semiconductor layers disposed on the barrier layer, and spaced apart from each other in a vertical direction, perpendicular to an upper surface of the active region; a gate structure filling a space between the plurality of semiconductor layers, disposed on the plurality of semiconductor layers, and extending in a first direction and overlapping the isolation region; and a first source/drain region and a second source/drain region on the active region. The active region extends in a second direction perpendicular to the first direction, and side surfaces of the active region in the first direction are aligned with side surfaces of the barrier layer in the first direction.

According to still another aspect of the inventive concept, a semiconductor device includes; a well region; a barrier epitaxial material layer epitaxially grown from an upper surface of the well region; a lower epitaxial semiconductor layer epitaxially grown from an upper surface of the barrier epitaxial material layer; an upper epitaxial semiconductor layer disposed on the lower epitaxial semiconductor layer and spaced apart from the lower epitaxial semiconductor layer; and a gate structure disposed on the upper epitaxial semiconductor layer while filling a space between the upper epitaxial semiconductor layer and the lower epitaxial semiconductor layer. The barrier epitaxial material layer includes first epitaxial regions and a second epitaxial region different from the first epitaxial regions, the first epitaxial regions are spaced apart from each other in a vertical direction, perpendicular to an upper surface of the well region, and the second epitaxial region is interposed between the first epitaxial regions.

According to still another aspect of the inventive concept, a method of fabricating a semiconductor device includes; forming a well region including a well impurity element in a substrate, by performing a well formation process; forming an epitaxially grown first layer epitaxially grown from the well region, and including a barrier impurity element, by performing a first epitaxial growth process including in-situ doping; and forming a stacked structure including second layers and third layers, alternately repeatedly stacked, by repeatedly performing a second epitaxial growth process and a third epitaxial growth process. Each of the second layers is provided as an un-doped semiconductor layer, and each of the third layers is provided as a sacrificial semiconductor layer having etch selectivity with respect to the second layers.

BRIEF DESCRIPTION OF DRAWINGS

The above and other aspects, features and other advantages of the inventive concept will be more clearly understood from the following detailed description, taken in conjunction with the accompanying drawings, in which:

FIGS. 13 to 19 are respective cross-sectional views illustrating an example of a method of forming a semiconductor device according to an example embodiment.

DETAILED DESCRIPTION

Figure 1:
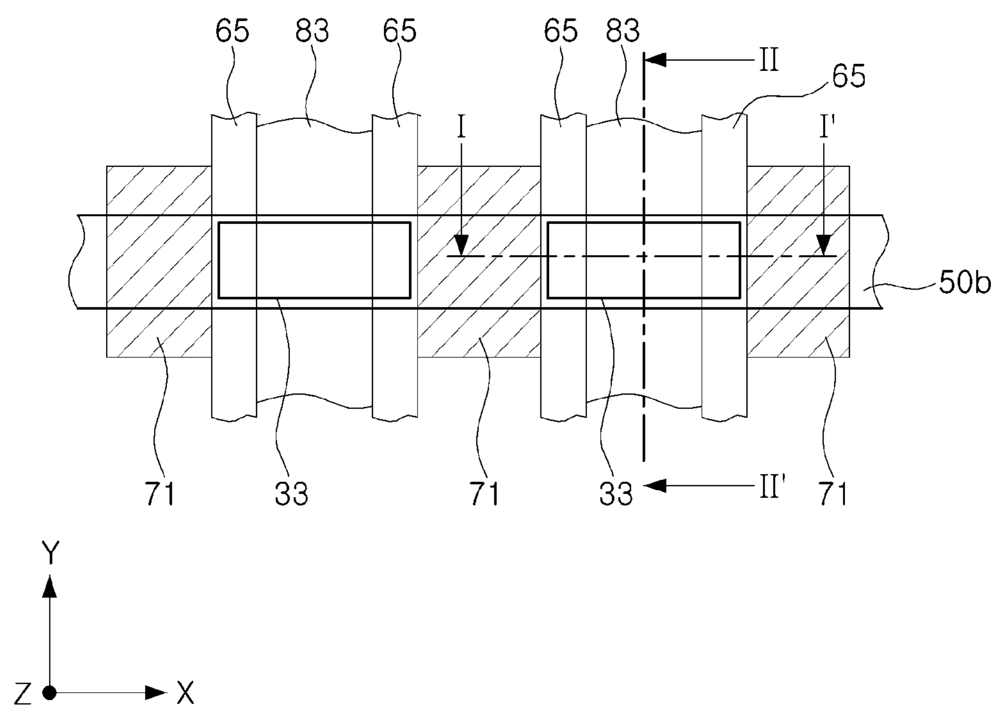
FIG. 1 is a plan view illustrating a semiconductor device according to example embodiments.
Figure 2:
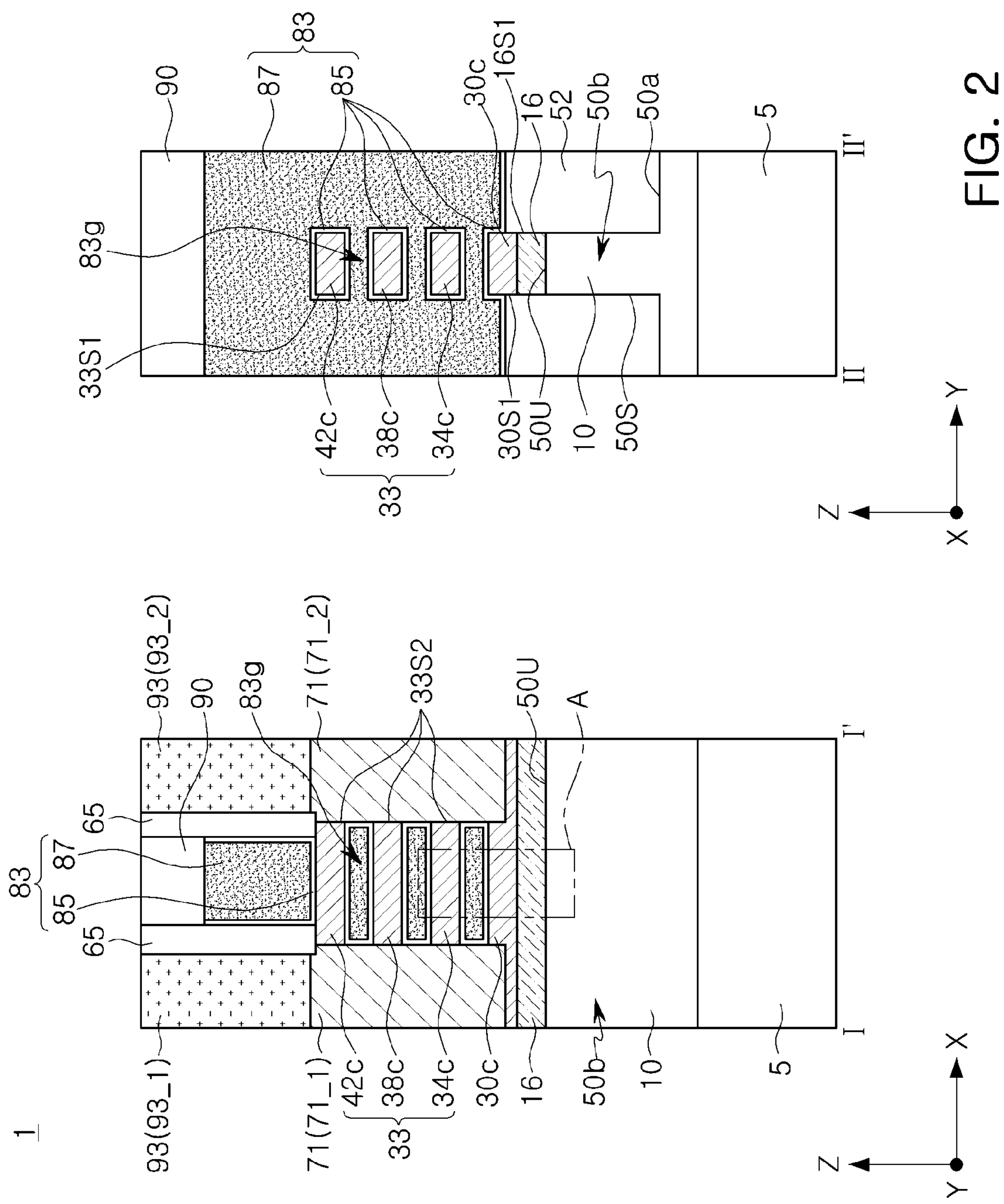
FIG. 2 is a cross-sectional view illustrating a semiconductor device according to an example embodiment.
Figure 3A:
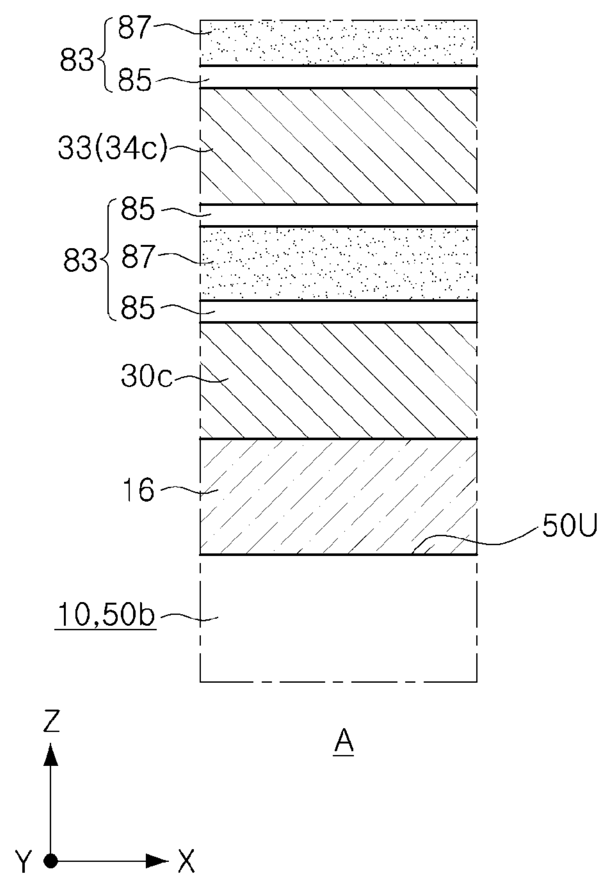
FIG. 3A is a partially enlarged cross-sectional view illustrating an example of a semiconductor device according to an example embodiment.

A semiconductor device 1 according to embodiments of the inventive concept will now be described with reference to FIGS. 1, 2, and 3A, wherein FIG. 1 is a plan view of the semiconductor device 1, FIG. 2 includes cross-sectional views of the semiconductor device 1 taken along line I-I' and line II-II' of FIG. 1, and FIG. 3A is an enlarged, partial view of a portion 'A' of FIG. 2.

Referring collectively to FIGS. 1, 2, and 3A, the semiconductor device 1 comprises an active region 50*b*, a barrier layer 16 on the active region 50*b*, a plurality of semiconductor layers 30*c* and 33 on the barrier layer 16, a gate structure 83, and source/drain regions 71. The semiconductor device 1 may further comprise a substrate 5 and an isolation region 52.

The substrate 5 may be a semiconductor substrate such as a silicon substrate, wherein the isolation region 52 may be disposed in a field trench 50*a* of the substrate 5 to define the active region 50*b*. The isolation region 52 may be formed of an insulating material such as silicon oxide.

The active region 50*b* may include a well region 10 including a well impurity element. The well region 10 may be an N-type or a P-type well. For example, the well region 10 may include one or more N-type well impurity element(s) such as phosphorus (P) or arsenic (As), or the well region may include one or more P-type well impurity element(s) such as boron (B).

As one example, the well region 10 shown in FIG. 2 is disposed in the active region 50*b* and extends to the substrate 5 below the isolation region 52.

The barrier layer 16 may be disposed between the plurality of semiconductor layers 30*c* and 33 and the active region 50*b*. The barrier layer 16 may include a barrier impurity element. Here, the provision of the barrier layer 16 prevents (or significantly reduces) the diffusion of well impurity element(s) from the well region 10 to the plurality of semiconductor layers 30*c* and 33.

In one example, the barrier layer 16 may include an epitaxial, crystalline material layer grown from the active region 50*b*. Thus, in certain embodiments of the inventive concept the barrier layer 16 may be referred to as a 'barrier epitaxial material layer.'

In one example, the active region 50*b* may be a crystalline silicon material layer, and the barrier layer 16 may include an epitaxial silicon material layer doped with one or more barrier impurity element(s) using an in-situ process while being epitaxially grown in a crystalline layer from an upper surface 50U of the active region 50*b*. The barrier impurity element(s) of the barrier layer 16 may be different from the well impurity element(s) of the well region 10. For example, oxygen (O) may be used as a barrier impurity element for the barrier layer 16 (e.g., the barrier layer 16 may be an epitaxial silicon material layer doped with oxygen). Alternately or additionally, carbon (C) may be used as a barrier impurity element for the barrier layer 16.

The barrier impurity element(s) of the barrier layer 16 may be included in concentration(s) capable of significantly reducing or preventing diffusion of the well impurity element(s) of the well region 10 into the plurality of semiconductor layers 30*c* and 33. while yet maintaining the barrier layer 16 in a crystalline form. For example, when the barrier layer 16 is an epitaxial silicon material layer doped with oxygen, wherein the concentration of oxygen in the barrier layer 16 ranges (e.g.) from about 1E15 atoms/$cm^3$ to about 1E22 atoms/$cm^3$.

The plurality of semiconductor layers 30*c* and 33 may be stacked and spaced apart from each other in a vertical direction Z perpendicular to the horizontal principal extension direction of an upper surface 50U of the active region 50*b*. Here, the terms "vertical" and "horizontal" are merely relative, spatial descriptors arbitrarily assigned for purposes of this description.

In one example, the plurality of semiconductor layers 30*c* and 33 may include a lower semiconductor layer 30*c* and one or a plurality of upper semiconductor layers 33 disposed on the lower semiconductor layer 30*c* and spaced apart from the lower semiconductor layer 30*c*. For example, one or a plurality of upper semiconductor layers 33 may be disposed on the lower semiconductor layer 30*c*.

In this regard, the one or the plurality of upper semiconductor layers 33 may be a plurality of upper semiconductor layers 34*c*, 38*c*, and 42*c*.

The lower semiconductor layer 30*c* may be an epitaxial semiconductor layer grown from an upper surface of the barrier layer 16. For example, the lower semiconductor layer 30*c* may be an epitaxial silicon layer grown from an upper surface of the barrier layer 16. The lower semiconductor layer 30*c* may be in contact with the barrier layer 16. Here, the lower semiconductor layer 30*c* may be referred to as a 'lower epitaxial semiconductor layer' or a 'lower epitaxial silicon layer.'

The plurality of upper semiconductor layers 34*c*, 38*c*, and 42*c* may be stacked and spaced apart from each other in the vertical direction Z.

In certain embodiments of the inventive concept, each of the plurality of upper semiconductor layers 34*c*, 38*c*, and 42*c* may be an epitaxial semiconductor layer. For example, each of the plurality of upper semiconductor layers 34*c*, 38*c*, and 42*c* may be an epitaxial silicon layer. Here, each of the plurality of upper semiconductor layers 34*c*, 38*c*, and 42*c* may be referred to as an 'upper epitaxial semiconductor layer' or an 'upper epitaxial silicon layer.'

In one example, at least a portion of the plurality of semiconductor layers 30c and 33 may be an un-doped epitaxial silicon material layer.

In another example, at least a portion of the plurality of semiconductor layers 30c and 33 may include the same impurity element as those impurity element(s) used in the well impurity element in the well region 10. For example, at least a portion of the plurality of semiconductor layers 30c and 33, for example, the lower semiconductor layer 30c, may include the same impurity element as the well impurity element in the well region 10, and a concentration of the impurity element in the lower semiconductor layer 30c may be less than a concentration of the well impurity element in the well region 10.

The source/drain regions 71 may be disposed on the active region 50b, extend in the vertical direction Z, and contact side surfaces 33S2 of the plurality of upper semiconductor layers 34c, 38c, and 42c in a second direction X. For example, the source/drain regions 71 may include a first source/drain region 71_1 and a second source/drain region 71_2, spaced apart from each other, and the plurality of upper semiconductor layers 34c, 38c, and 42c may be disposed between the first source/drain region 71_1 and the second source/drain region 71_2. The barrier layer 16 may further include a first portion between the first source/drain region 71_1 and the active region 50b, and a second portion between the second source/drain region 71_2 and the active region 50b.

In one example, the gate structure 83 may extend to the isolation region 52 while overlapping the active region 50b. The gate structure 83 may extend in a first direction Y, and the active region 50b may extend in the second direction X, perpendicular to the first direction Y. Each of the first direction Y and the second direction X may be disposed parallel to the upper surface 50U of the active region 50b. The gate structure 83 may be disposed on the plurality of upper semiconductor layers 34c, 38c, 42c while filling a space between the plurality of upper semiconductor layers 34c, 38c, and 42c.

The gate structure 83 may cover an upper surface, a lower surface, and side surfaces 33S1 in the first direction Y, of each of the plurality of upper semiconductor layers 34c, 38c, and 42c. The gate structure 83 may cover at least a portion of the side surfaces 30S1 of the lower semiconductor layer 30c in the first direction Y while covering an upper surface of the lower semiconductor layer 30c.

The gate structure 83 may include a gate dielectric 85 and a gate electrode 87. The gate dielectric 85 may include silicon oxide and/or a high-k dielectric. The gate electrode 87 may include a conductive material. The gate dielectric 85 may be interposed between the gate electrode 87 and the plurality of semiconductor layers 30c and 33, between the gate electrode 87 and the source/drain regions 71, between the isolation region 52 and the gate electrode 87, and disposed on side surfaces of the gate electrode 87 positioned at a higher level than that of the plurality of semiconductor layers 30c and 33. In this context, the term "higher level" is a relative spatial descriptor used in relation to separation distances between various elements and the principal surface of the substrate 5.

The semiconductor device 1 may further comprise a gate capping pattern 90 on the gate structure 83, contact plugs 93 on the source/drain regions 71, and gate spacers 65. The contact plugs 93 may include a first contact plug 93_1 electrically connected to the first source/drain region 71_1 and a second contact plug 93_2 electrically connected to the second source/drain region 71_2. The gate capping pattern 90 may be formed of an insulating material. The gate spacers 65 may be interposed between the gate capping pattern 90 and the contact plugs 93, and between the gate structure 83 and the contact plugs 93.

In certain embodiments of the inventive concept, the barrier layer 16 may improve leakage current characteristics of the semiconductor device 1. For example, the source/drain regions 71, the plurality of semiconductor layers 30c and 33 used as a channel region between the source/drain regions 71, and the gate structure 83 may form a MOSFET having a three-dimensional channel structure. In such a MOSFET, the barrier layer 16 may block or significantly reduce a leakage current between the lower semiconductor layer 30c, of the plurality of semiconductor layers 30c and 33, and the substrate 5. Moreover, the barrier layer 16 may block or significantly reduce a leakage current between the source/drain regions 71 and the substrate 5. Thus, the barrier layer 16 may improve a function of the overall operating characteristics of the semiconductor device 1.

In one example, the barrier impurity element in the barrier layer 16 may be uniformly distributed in the barrier layer 16. In another example, the concentration of the barrier impurity element in the barrier layer 16 may be higher at a lower region of the barrier layer 16 than in an upper region of the barrier layer 16. In still another example, the concentration of the barrier impurity element in the barrier layer 16 may gradually vary from a lower region in the barrier layer 16 to an upper region of the barrier layer 16.

In certain embodiments of the inventive concept, the barrier layer 16 may include one or more first regions and one or more second regions. Here, a first region may be a region having a concentration of the barrier impurity element relatively higher than the second region(s). Alternatively, a first region may be a region including the barrier impurity element, whereas a second region may be a region lacking the barrier impurity element.

Figure 3B:
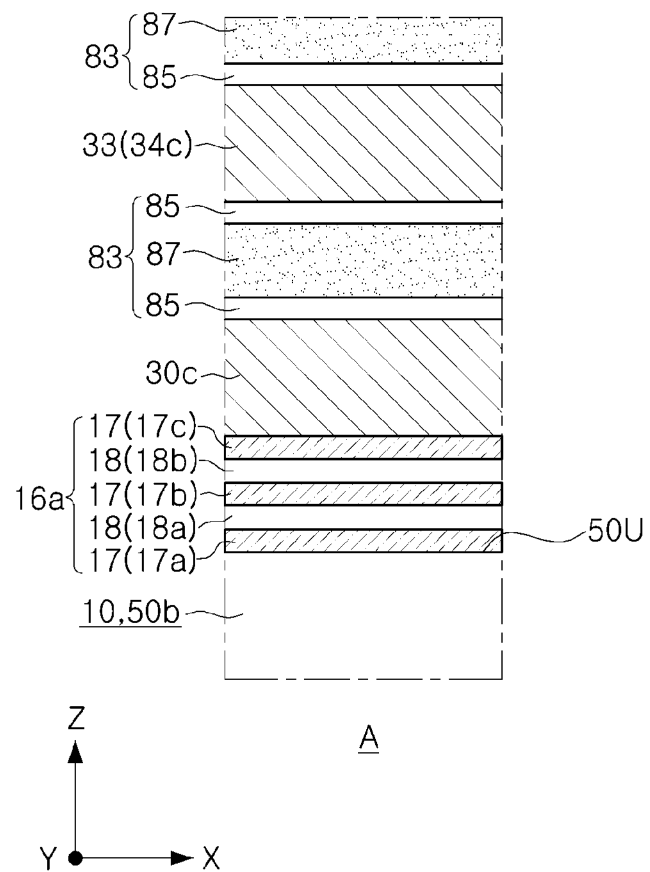
FIG. 3B is a partially enlarged cross-sectional view illustrating a modified example of a semiconductor device according to an example embodiment.

In the illustrated example of FIG. 3B, the barrier layer 16 includes a plurality of first regions and a plurality of second regions. Here, analogous to FIG. 3A, FIG. 3B is an enlarged, partial view of region 'A' in FIG. 2.

Referring to FIG. 3B, the barrier layer 16a includes at least one first region 17 in contact with at least one second region 18.

However, the first region 17 may be provided as a plurality of first regions, and the second region 18 may be provided as a plurality of second regions. In one example, the barrier layer 16a may include first regions 17a and 17b as well as a second region 18a, between the first regions 17a and 17b, spaced apart from each other in the vertical direction Z. As another example, the barrier layer 16a may include a plurality of first regions 17a, 17b, and 17c as well as a plurality of second regions 18a and 18b. The plurality of first regions 17a, 17b, and 17c as well as the plurality of second regions 18a and 18b may be stacked alternately in the vertical direction Z. Among the plurality of first regions 17a, 17b, and 17c as well as the plurality of second regions 18a and 18b, stacked alternately, a lowermost first region 17a may be disposed in a lowermost portion, and an uppermost first region 17c may be disposed in an uppermost portion.

The plurality of second regions 18a and 18b may be different from the plurality of first regions 17a, 17b, and 17c. For example, the plurality of first regions 17a, 17b, and 17c may be a region including a barrier impurity element, and a concentration of a barrier impurity element of at least one among the plurality of second regions 18a and 18b may be about zero, or may be less than a concentration of a barrier impurity element in the plurality of first regions 17*a*, 17*b*, and 17*c*. For example, a concentration of a barrier impurity element of each of the plurality of second regions 18*a* and 18*b* may be about zero, or may be less than a concentration of a barrier impurity element in the plurality of first regions 17*a*, 17*b*, and 17*c*.

Each of the plurality of first regions 17*a*, 17*b*, and 17*c* may be formed of a doped epitaxial semiconductor material including a barrier impurity element, for example, an epitaxial silicon material, and each of the plurality of second regions 18*a* and 18*b* may include an epitaxial semiconductor material not including a barrier impurity element, or including a smaller amount of a barrier impurity element as compared with the plurality of first regions 17*a*, 17*b*, and 17*c*, for example, an epitaxial silicon material. As an example, each of the plurality of second regions 18*a* and 18*b* may be formed of an un-doped epitaxial silicon material.

Each of the plurality of first regions 17*a*, 17*b*, and 17*c* may be referred to as a 'first epitaxial region,' and each of the plurality of second regions 18*a* and 18*b* may be referred to as a 'second epitaxial region.'

Each of the plurality of first regions 17*a*, 17*b*, and 17*c* may be referred to as a 'barrier region,' and each of the plurality of second regions 18*a* and 18*b* may be referred to as a 'buffer region.' For example, the plurality of first regions 17*a*, 17*b*, and 17*c* may be a 'barrier region' suppressing diffusion or a leakage current. The plurality of second regions 18*a* and 18*b* may be a 'buffer region' preventing amorphization of the plurality of first regions 17*a*, 17*b*, and 17*c* by increasing a concentration of a barrier impurity element in the plurality of first regions 17*a*, 17*b*, and 17*c*.

Figure 4:
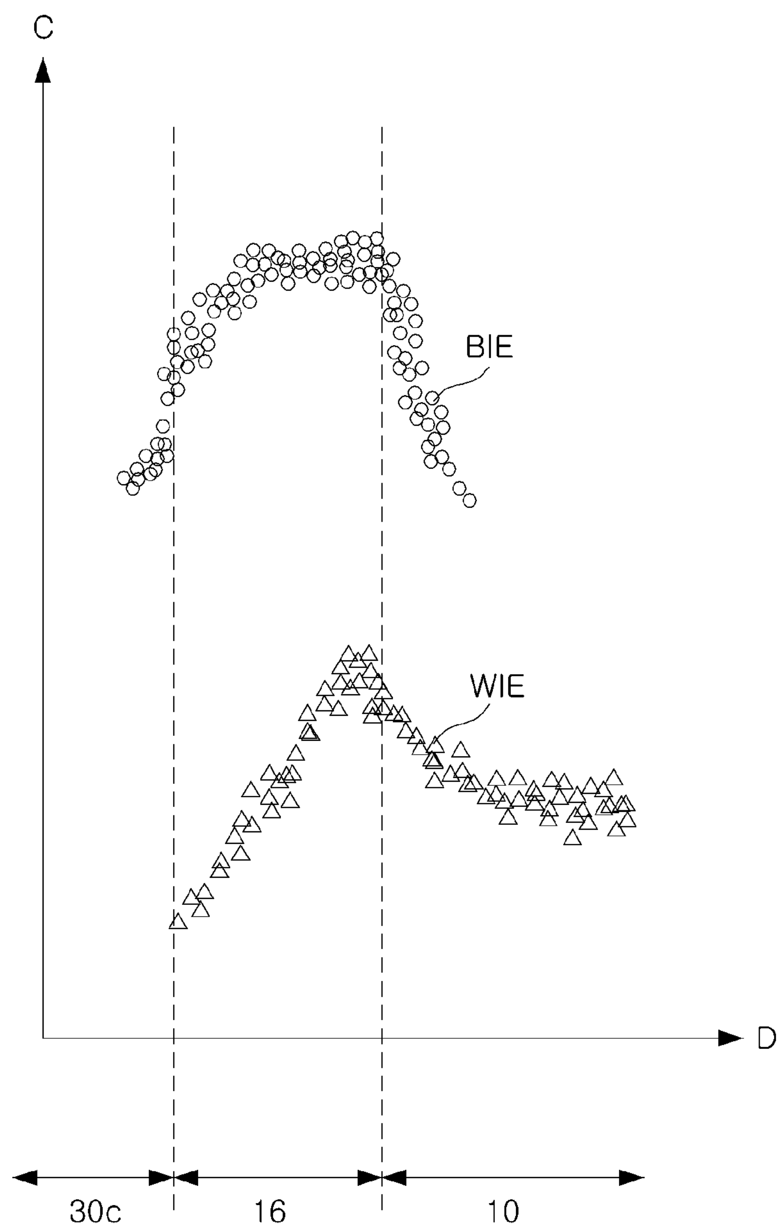
FIG. 4 is a graph illustrating an impurity concentration in a portion of layers of a semiconductor device according to an example embodiment.

FIG. 4 is a graph illustrating a concentration distribution of a well impurity element WIE and a barrier impurity element BIE in the barrier layer 16 and the well region 10. In a graph of FIG. 4, the axis labeled 'D' indicates a depth in a direction from a surface of the lower semiconductor layer 30*c* to the well region 10, and the axis labeled 'C' indicates an impurity concentration.

Referring to FIG. 4, the barrier layer 16 may be disposed between the well region 10 and the lower semiconductor layer 30*c*. The barrier layer 16 may include a barrier impurity element BIE, and the well region 10 may include a well impurity element WIE. As an example, the barrier impurity element BIE may be oxygen (O), and the well impurity element WIE may be arsenic (As).

The well impurity element WIE in the well region 10 is diffused, and a concentration of the well impurity element increases toward the barrier layer 16, so the concentration of the well impurity element reaches a maximum in the barrier layer 16. For example, the well impurity element WIE in the well region 10 is diffused, and thus may be filed-up at a boundary region between the barrier layer 16 and the well region 10 or in the barrier layer 16 adjacent to the well region 10. Thus, the barrier layer 16 may include the well impurity element WIE diffused from the well region 10 to be filed-up together with the barrier impurity element BIE. A concentration of the well impurity element WIE in the barrier layer 16 may be higher than a concentration of the well impurity element WIE in the well region 10. The barrier layer 16 may prevent or significantly reduce diffusion of the well impurity element WIE in the well region 10 into the lower semiconductor layer 30*c*.

Figure 5A:
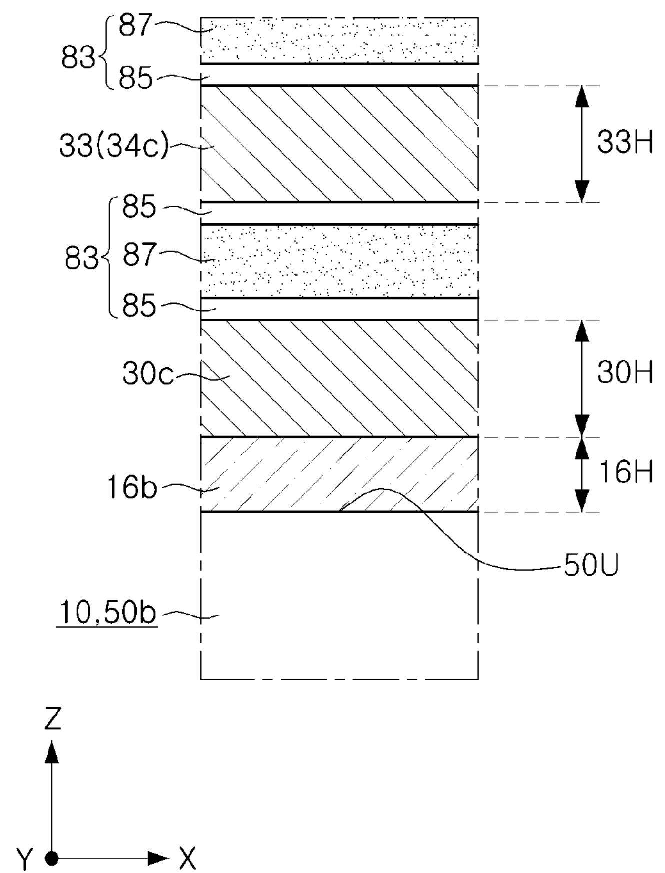
FIG. 5A is a partially enlarged cross-sectional view illustrating a modified example of a semiconductor device according to an example embodiment.
Figure 5B:
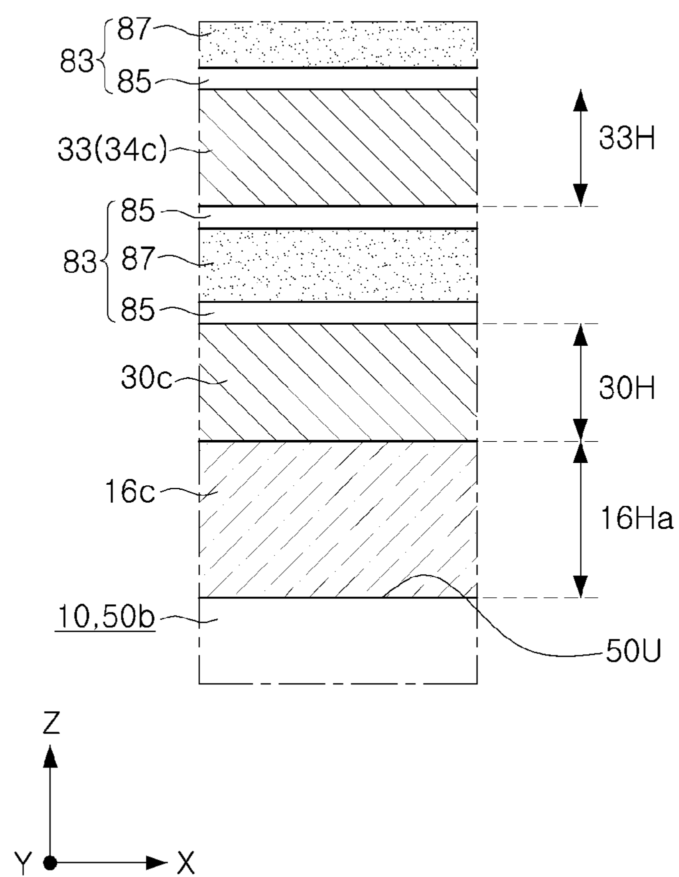
FIG. 5B is a partially enlarged cross-sectional view illustrating a modified example of a semiconductor device according to an example embodiment.

FIGS. 5A and 5B illustrate various modified examples for the thickness of the barrier layer 16. Thus, FIGS. 5A and 5B respectively illustrate the enlarged partial view of region 'A' of FIG. 2.

Referring to FIG. 5A, a barrier layer 16*b* may have a thickness 16H less than a thickness 33H of at least one among the plurality of semiconductor layers 30*c* and 33. For example, a thickness 16H of the barrier layer 16*b* may be less than a thickness 30H of the lower semiconductor layer 30*c*, and may be less than a thickness 33H of each of the plurality of upper semiconductor layers 33. The barrier layer 16 of FIGS. 2 and 3A may be replaced with the barrier layer 16*b* described above. As described above, a barrier layer 16*b* having a relatively less thickness 16H may improve a degree of integration of a semiconductor device.

Referring to FIG. 5B, a barrier layer 16*c* may have a thickness 16Ha greater than a thickness 33H of at least one among the plurality of semiconductor layers 30*c* and 33. For example, a thickness 16Ha of the barrier layer 16*b* may be greater than a thickness 30H of the lower semiconductor layer 30*c*, and may be greater than a thickness 33H of each of the plurality of upper semiconductor layers 33. The barrier layer 16 of FIGS. 2 and 3A may be replaced with the barrier layer 16*c* described above. As described above, a barrier layer 16*c* having a relatively great thickness 16Ha may improve leakage current characteristics of a semiconductor device. Moreover, since the barrier layer 16*c* having a relatively great thickness 16Ha may act as a stressor applying stress to the source/drain regions (71 of FIG. 2) to improve carrier mobility in the plurality of semiconductor layers 30*c* and 33 used as a channel region formed between the source/drain regions (71 of FIG. 2), a function of a semiconductor device may be improved.

Figure 6A:
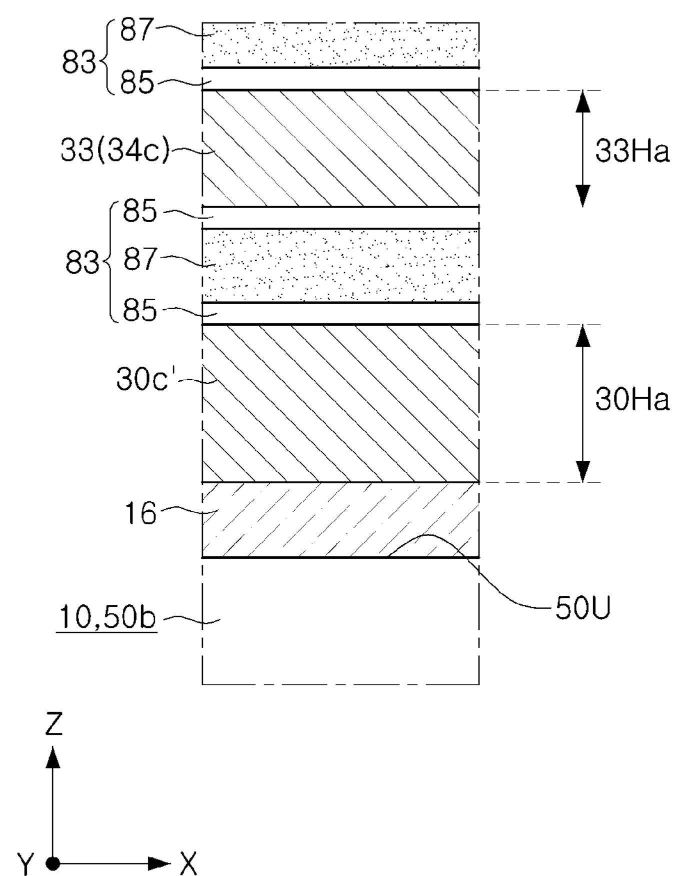
FIG. 6A is a partially enlarged cross-sectional view illustrating a modified example of a semiconductor device according to an example embodiment.
Figure 6B:
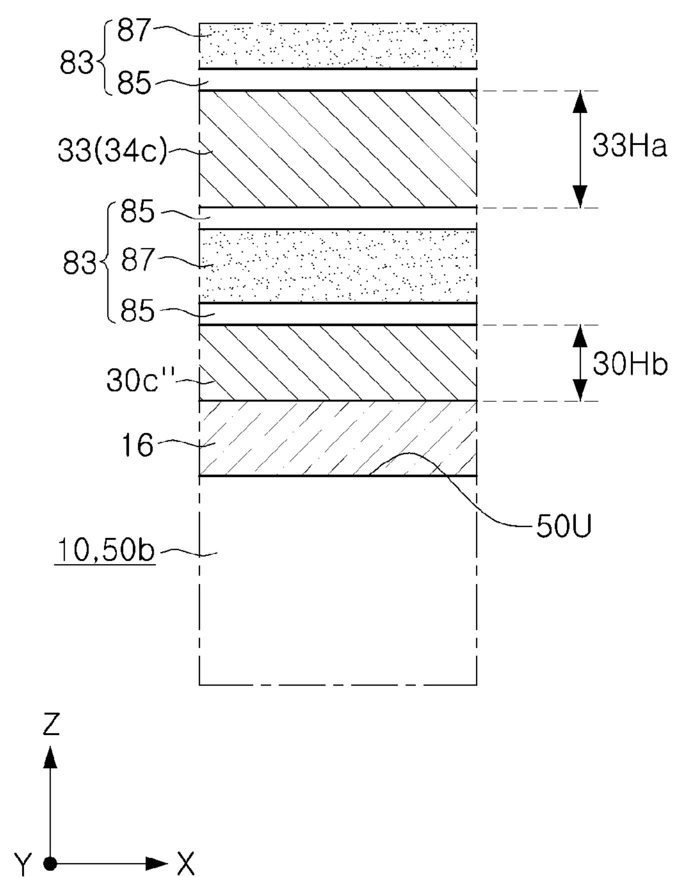
FIG. 6B is a partially enlarged cross-sectional view illustrating a modified example of a semiconductor device according to an example embodiment.

In similar manner, FIGS. 6A and 6B illustrate various modified examples of the lower semiconductor layer 30*c*. Hence, FIGS. 6A and 6B are also enlarged partial views of region 'A' of FIG. 2.

Referring to FIG. 6A, a lower semiconductor layer 30*c*' may have a thickness 30Ha greater than a thickness 33Ha of each of the plurality of upper semiconductor layers 33. The lower semiconductor layer 30*c*', described above, may be replaced with the lower semiconductor layer (30*c* of FIGS. 2, 3A, 5A, and 5B), described previously.

Referring to FIG. 6B, a lower semiconductor layer 30*c*" may have a thickness 30Hb less than a thickness 33Ha of each of the plurality of upper semiconductor layers 33. The lower semiconductor layer 30*c*", described above, may be replaced with the lower semiconductor layer (30*c* of FIGS. 2, 3A, 5A, and 5B), described previously.

Figure 7:
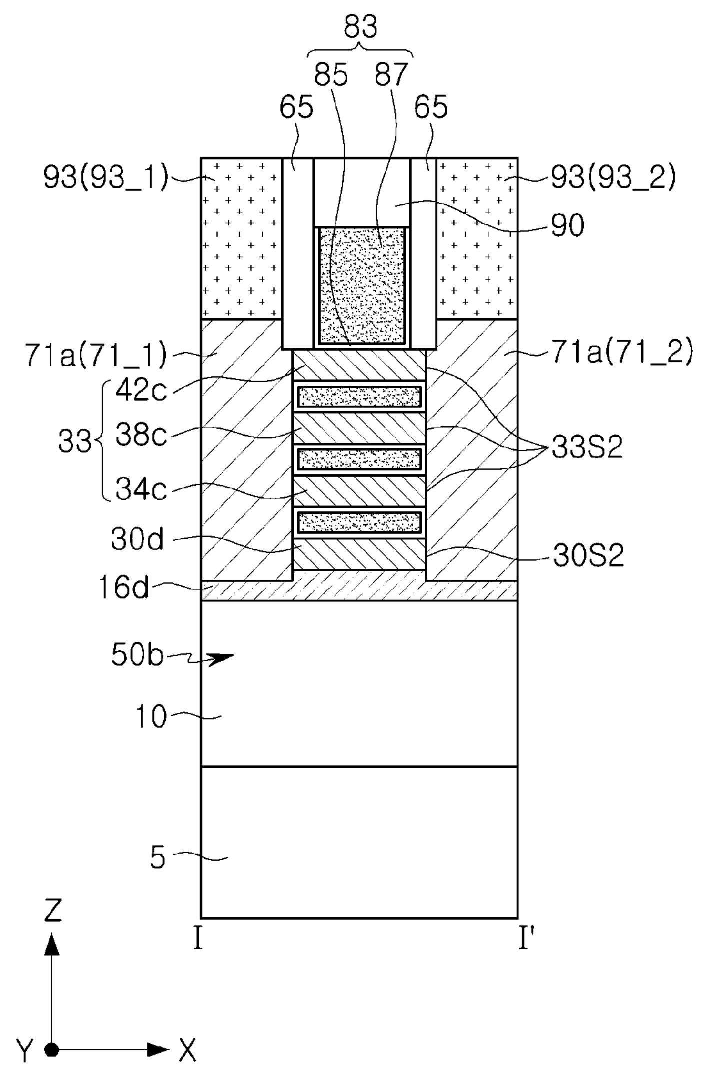
FIG. 7 is a cross-sectional view illustrating a modified example of a semiconductor device according to an example embodiment.
Figure 8:
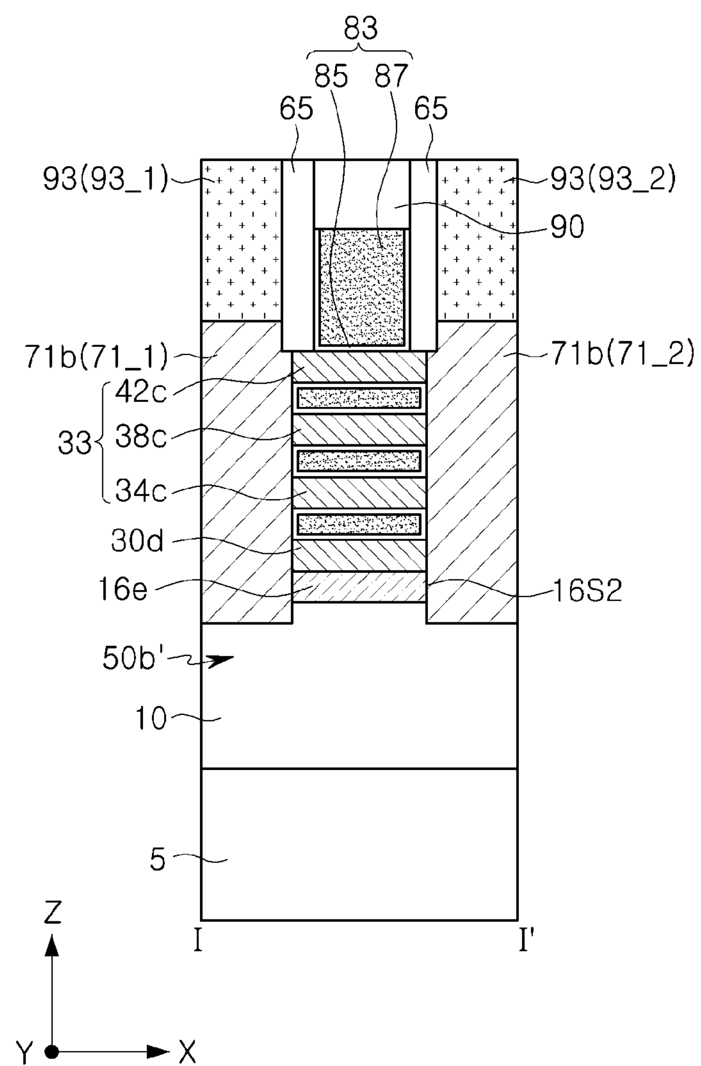
FIG. 8 is a cross-sectional view illustrating a modified example of a semiconductor device according to an example embodiment.

FIGS. 7 and 8 illustrate various modified examples of the barrier layer 16, the lower semiconductor layer 30*c*, and the source/drain regions 71, where FIG. 7 is a cross-sectional view of the region taken along line I-I' of FIG. 1.

Referring to FIG. 7, a barrier layer 16*d* and source/drain regions 71*a* directly contact each other (i.e., no intervening layers or elements are present). Here, the lower semiconductor layer 30*d* may have side surfaces 30S2 in the second direction X, and the source/drain regions 71*a* may be in contact with side surfaces 30S2 of the lower semiconductor layer 30*d* in the second direction X.

The barrier layer 16*d* may include a first thickness portion and a second thickness portion, thinner than the first thickness portion. The first thickness portion of the barrier layer 16*d* may be a portion interposed between the lower semiconductor layer 30*d* and the active region 50*b*, and the second thickness portion of the barrier layer 16*d* may be a portion interposed between the source/drain regions 71*a* and the active region 50*b*.

The barrier layer 16*d*, the lower semiconductor layer 30*d*, and the source/drain regions 71*a*, described above, may be replaced with the barrier layer (16 of FIG. 2), the lower semiconductor layer (30 of FIG. 2), and the source/drain regions (71 of FIG. 2), described previously.

Referring to FIG. 8, the barrier layer 16*e* may be self-aligned with the lower semiconductor layer 30*d* having side surfaces in the second direction X as described with reference to FIG. 7. Thus, the barrier layer 16*e* may have side surfaces 16S2 in the second direction X. The source/drain regions 71*b* may be in direct contact with the well region 10 in the active region 50*b*.' The source/drain regions 71*b* may be in contact with side surfaces of the lower semiconductor layer 30*d* in the second direction X and side surfaces 16S2 of the barrier layer 16*e* in the second direction X.

The barrier layer 16*e*, the lower semiconductor layer 30*d*, and the source/drain regions 71*b* described above, may respectively replaced the barrier layer 16 of FIG. 2, the lower semiconductor layer 30 of FIG. 2, and/or the source/drain regions 71 of FIG. 2.

Figure 9:
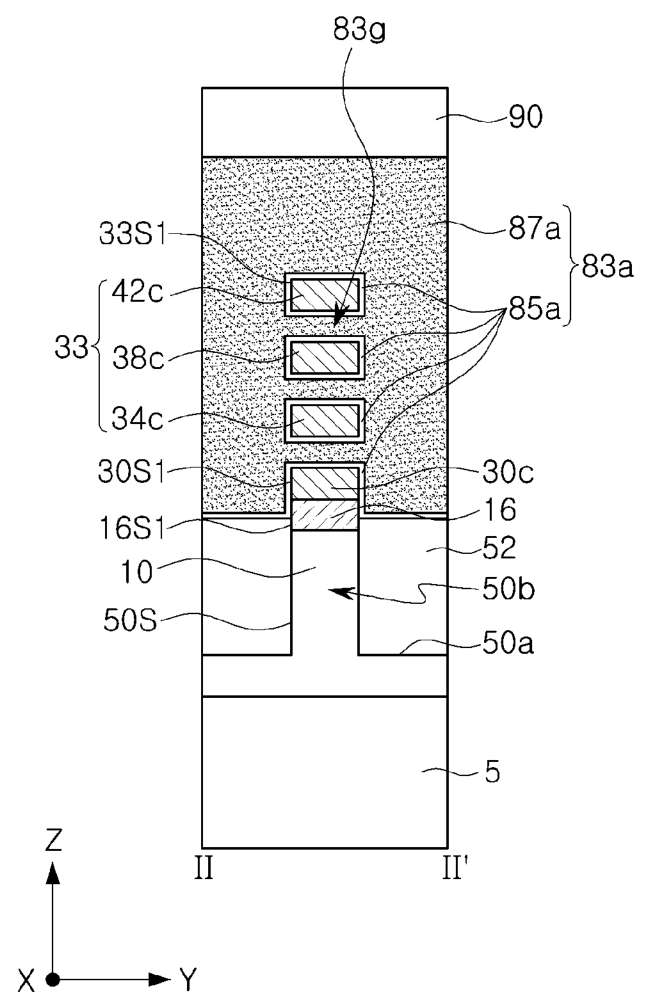
FIG. 9 is a cross-sectional view illustrating a modified example of a semiconductor device according to an example embodiment.
Figure 10:
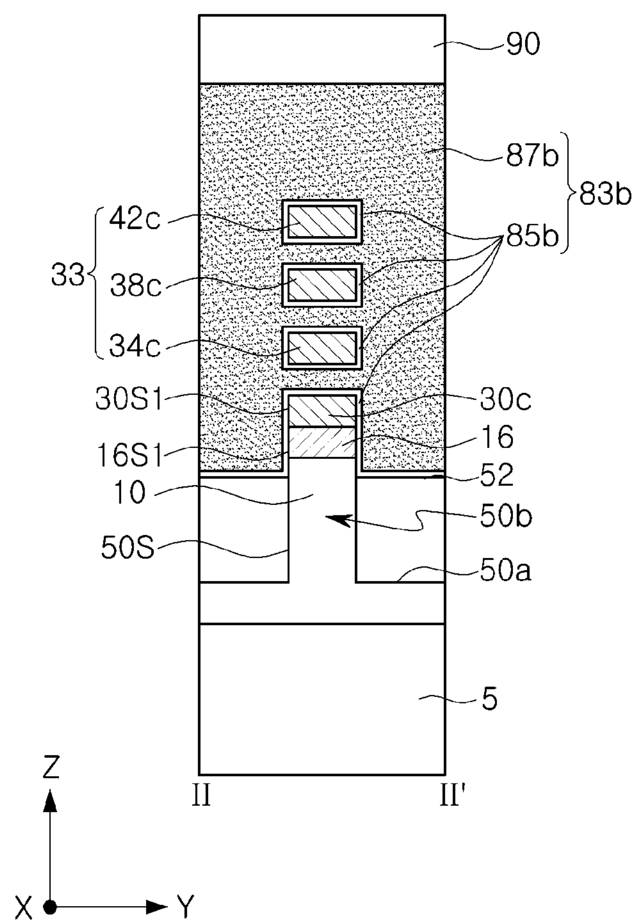
FIG. 10 is a cross-sectional view illustrating a modified example of a semiconductor device according to an example embodiment.

FIGS. 9 and 10 illustrate various modified examples of the gate structure 83 and are respective cross-sectional views of the region taken along line II-II' of FIG. 1.

Referring to FIG. 9, a gate structure 83*a* covers side surfaces 30S1 of the lower semiconductor layer 30*c* in the first direction Y while covering an upper surface of the lower semiconductor layer 30*c*, and extends downward to cover at least a portion of side surfaces 16S1 of the barrier layer 16 in the first direction Y. The gate structure 83*a* may include a gate dielectric 85*a* and a gate electrode 87*a*, and the gate dielectric 85*a* may be in direct contact with at least a portion of an upper surface of the lower semiconductor layer 30*c*, side surfaces 30S1 of the lower semiconductor layer 30*c* in the first direction Y, and side surfaces 16S1 of the barrier layer 16 in the first direction Y. The gate structure 83*a* described above may replace the gate structure 83 of FIG. 2.

Referring to FIG. 10, the gate structure 83*b* may cover portions of side surfaces 30S1 of the lower semiconductor layer 30*c* in the first direction Y, side surfaces 16S1 of the barrier layer 16 in the first direction Y, and side surfaces 50S of the active region 50*b* in the first direction Y, while covering an upper surface of the lower semiconductor layer 30*c*. The gate structure 83*b* may include a gate dielectric 85*b* and a gate electrode 87*b*, and the gate dielectric 85*b* may be in contact with portions of an upper surface of the lower semiconductor layer 30*c*, side surfaces 30S1 of the lower semiconductor layer 30*c* in the first direction Y, side surfaces 16S1 of the barrier layer 16 in the first direction Y, and side surfaces 50S of the active region 50*b* in the first direction Y. The gate structure 83*b* described above may replace the gate structure 83 of FIG. 2.

Figure 11A:
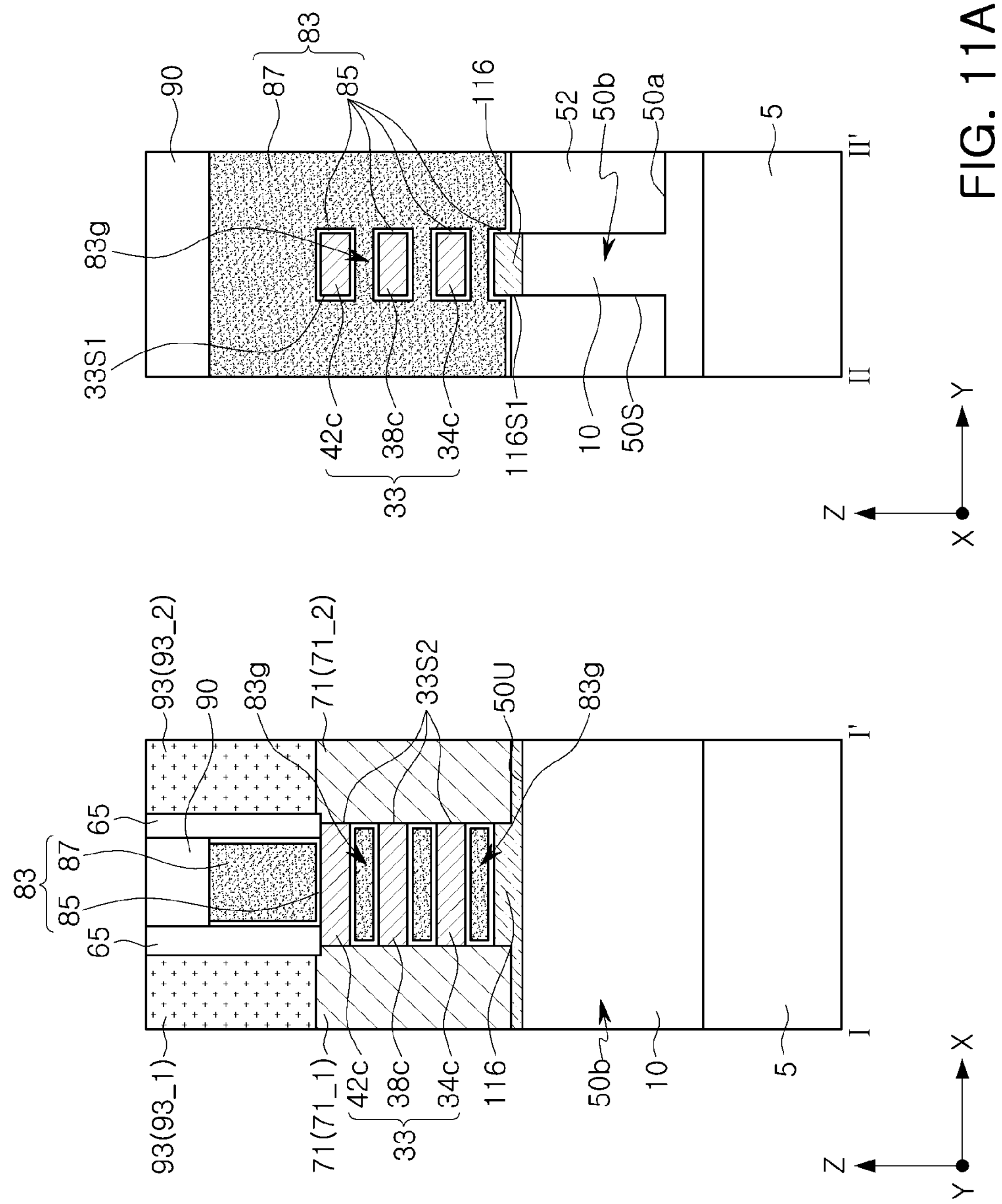
FIG. 11A is a cross-sectional view illustrating a modified example of a semiconductor device according to an example embodiment.

FIG. 11A illustrates a modified example of the barrier layer 16 and the plurality of semiconductor layers 30*c* and 33 and is a cross-sectional view of the region taken along lines I-I' and II-II' of FIG. 1.

Referring to FIG. 11A, among the plurality of semiconductor layers (30*c* and 33 of FIG. 2), the lower semiconductor layer 30*c* may be omitted. Thus, the plurality of upper semiconductor layers 33 may be disposed on the barrier layer 116.

The gate structure 83 may include a gapfill portion 83*g* filling a space between a lowermost upper semiconductor layer 34*c*, of the plurality of upper semiconductor layers 33, and the barrier layer 116, while filling a space between the plurality of upper semiconductor layers 33. An upper surface of the barrier layer 116 may be in contact with the gapfill portion 83*g* of the gate structure 83.

A portion of the side surfaces 116S1 of the barrier layer 116 in the first direction Y may be in contact with the gate structure 83. The barrier layer 116 may be in contact with the source/drain regions 71. The barrier layer 116 may include a first thickness portion, interposed between the gate structure 83 and the active region 50*b*, and a second thickness portion interposed between the source/drain regions 71 and the active region 50*b*. The first thickness portion of the barrier layer 116 may be thicker than the second thickness portion of the barrier layer 116.

Referring back to FIG. 2, among the plurality of semiconductor layers 30*c* and 33, the lower semiconductor layer 30*c* may be omitted, and the barrier layer 116 may be replaced with the "modified" barrier layer 116 of FIG. 11A.

Figure 11B:
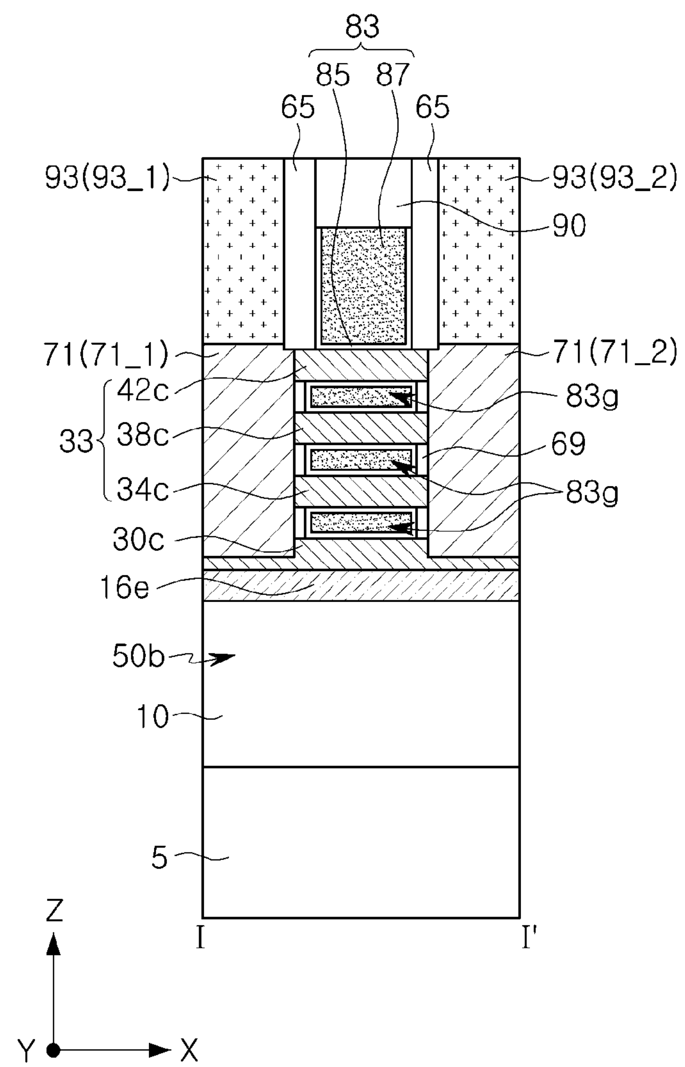
FIG. 11B is a cross-sectional view illustrating a modified example of a semiconductor device according to an example embodiment.

FIG. 11B illustrates a modified example of the semiconductor device illustrated in FIG. 2 according to certain embodiments of the inventive concept. Hence, FIG. 11B is a cross-sectional view illustrating a region taken along line I-I' of FIG. 1.

Referring to FIG. 11B, the gapfill portion 83*g* of the gate structure 83 may be spaced apart from the source/drain regions 71. For example, the inner spacers 69 having insulating properties may be disposed between the gapfill portion 83*g* of the gate structure 83 and the source/drain regions 71.

Figure 12:
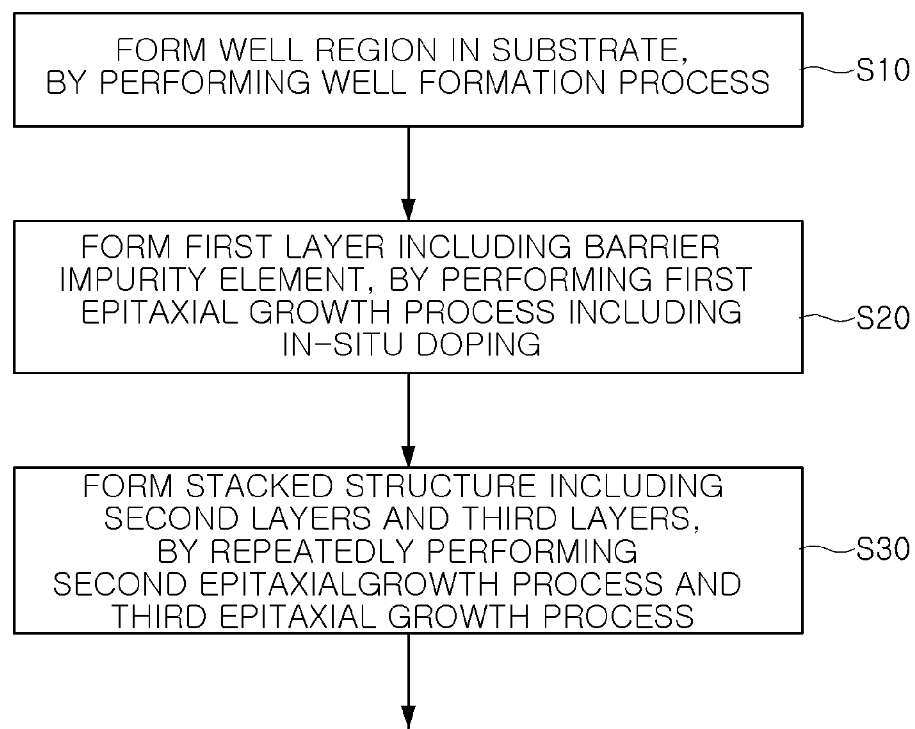
FIG. 12 is a process flow diagram illustrating a method of forming a semiconductor device according to an example embodiment.

Referring now to FIGS. 1, 2 and 12 to 19 (inclusive), certain embodiments of the inventive concept directed to methods of fabricating a semiconductor device will be described. Here, FIG. 12 is a general process flow chart for the exemplary methods, and FIGS. 13 to 19 are respective, cross-sectional views illustrating a region taken along line I-I' and a region taken along line II-II' of FIG. 1.

Figure 13:
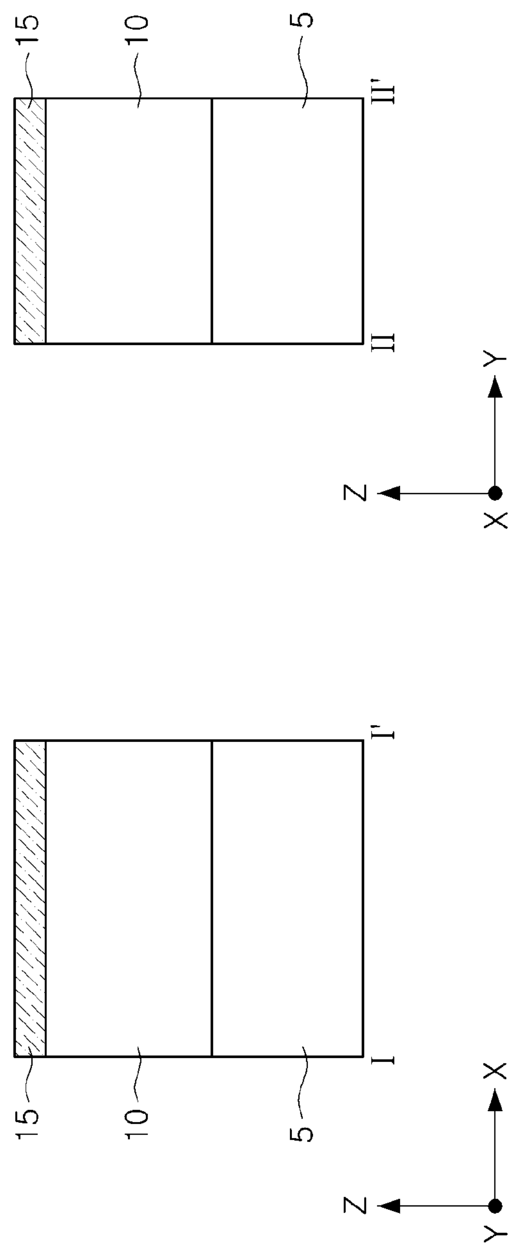

Referring to FIGS. 1, 12, and 13, a substrate 5 may be prepared. The substrate 5 may be a bulk semiconductor substrate or a Silicon On Insulator (SOI) substrate.

A well formation process is performed, to form a well region 10 in the substrate 5 (S10). The well region 10 may be a P-type well region or an N-type well region. The well formation process may include injecting a well impurity element into the substrate 5 by performing an ion implantation process, and activation of the well impurity element in the substrate 5 by performing an annealing process.

By performing a first epitaxial growth process, a first layer 15 including a barrier impurity element may be formed (S20). The first layer 15 may be a first epitaxial material layer, grown from the well region 10 of the substrate 5, and may be in-situ doped with the barrier impurity element.

As an example, forming the first layer 15 for formation of the barrier layer (16*a* of FIG. 3B) described above with reference to FIG. 3B may include repeatedly performing a set of operations, wherein the set of operations includes: forming a doped epitaxial silicon layer (17*a* of FIG. 3B) grown from the well region 10, and doped with a barrier impurity element; forming an un-doped epitaxial silicon layer (18*a* of FIG. 3B) grown from the doped epitaxial silicon layer (17*a* of FIG. 3B), and forming a doped epitaxial silicon layer (17*b* of FIG. 3B) grown from the un-doped epitaxial silicon layer (18*a* of FIG. 3B) and doped with the barrier impurity element. As an example, the barrier impurity element may be oxygen (O) or carbon (C).

Figure 14:
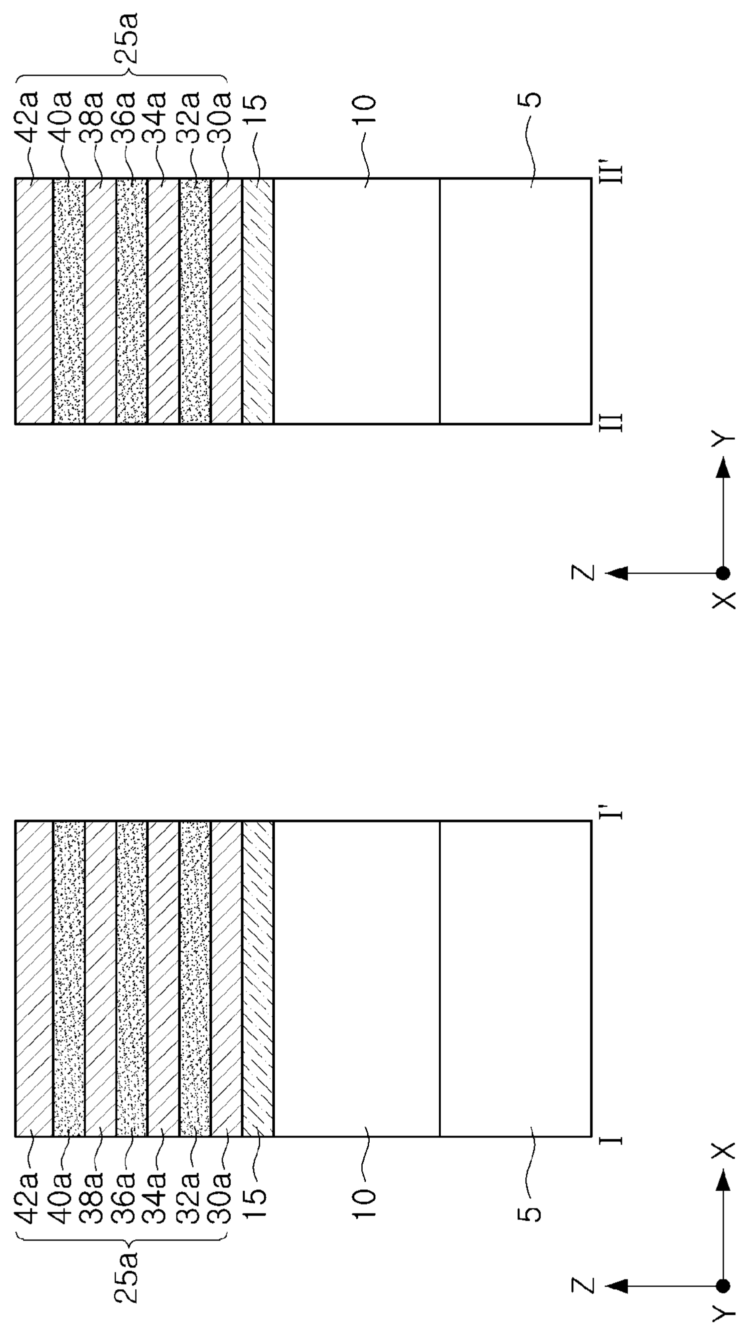

Referring to FIGS. 1, 12, and 14, a second epitaxial growth process and a third epitaxial growth process are repeatedly performed to form a stacked structure 25*a* including second layers 30*a*, 34*a*, 38*a*, and 42*a* as well as third layers 32*a*, 36*a*, and 40*a* (S20). For example, forming the stacked structure 25*a* may include repeatedly performing a set of operations, wherein the set of operations includes a second epitaxial growth process and a third epitaxial growth process. For example, the second epitaxial growth process is performed to form a lowermost second layer 30*a* grown from the first layer 15, the third epitaxial growth process is performed to form a lowermost third layer 32*a* grown from the lowermost second layer 30*a*, the second epitaxial growth process is performed to form the other second layer 34*a* grown from the lowermost third layer 32*a*, and the third epitaxial growth process is performed to form the other third layer 36*a* grown from the other second layer 34*a*.

In one example, the second layers 30*a*, 34*a*, 38*a*, and 42*a* may be an un-doped epitaxial silicon layer, and the third layers 32*a*, 36*a*, and 40*a* may be an epitaxial silicon germanium layer having etch selectivity with respect to the second layers 30*a*, 34*a*, 38*a*, and 42*a*.

In one example, among the second epitaxial growth process and the third epitaxial growth process repeatedly performed, a second epitaxial growth process may be ultimately performed. For example, among the second layers 30*a*, 34*a*, 38*a*, and 42*a*, and the third layers 32*a*, 36*a*, and 40*a*, a layer positioned at a lowermost portion may be a lowermost second layer 30*a*, and a layer positioned at an uppermost portion may be an uppermost second layer 42*a*.

As another example, among the second epitaxial growth process and the third epitaxial growth process repeatedly performed, a third epitaxial growth process may be ultimately performed.

Figure 15:
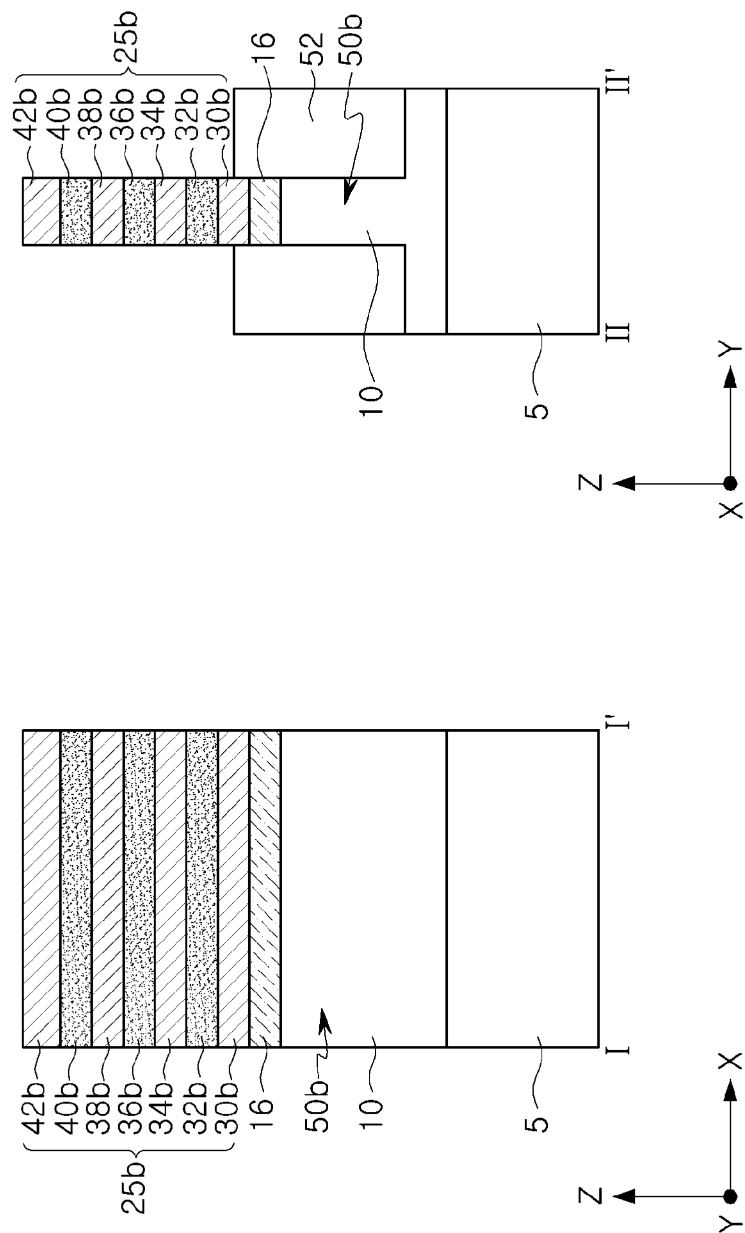

Referring to FIGS. 1 and 15, the stacked structure (25*a* of FIG. 14), the first layer 15 of FIG. 14) and the substrate 5 are etched to form a field trench 50*a*.

The field trench 50*a* may define an active region 50*b* in the substrate 5. While the field trench 50*a* is formed, the first layer (15 of FIG. 14) is etched to be formed as a first pattern 16, and the stacked structure (25*a* of FIG. 14) is etched to be formed as a stacked line 25*b*.

The first pattern 16 may be referred to as a 'barrier layer' described previously with reference to FIG. 2. In the following method description, a reference numeral 16 refers to a 'first pattern.'

The stacked line 25*b* may include second lines 30*b*, 34*b*, 38*b*, and 42*b* formed by etching the second layers (30*a*, 34*a*, 38*a*, and 42*a* of FIG. 14), and third lines (32*b*, 36*b*, and 40*b* of FIG. 14) formed by etching the third layers (32*a*, 36*a*, and 40*a* of FIG. 14).

Here, the well region 10 may remain in the active region 50*b*, where the well region 10 may remain in the substrate 5 below the field trench 50*a* while remaining in the active region 50*b*.

An isolation region 52 partially filling the field trench 50*a* may be provided. The isolation region 52 may be formed of an insulating material such as silicon oxide, or the like.

An upper surface of the isolation region 52 may be formed at a level, lower than that of an upper surface of a lowermost second line 30*b*, of the second lines 30*b*, 34*b*, 38*b*, and 42*b*, and higher than an upper surface of the first pattern 16.

In a modified example, an upper surface of the isolation region 52 may be formed at a level lower than that of an upper surface of the first pattern 16, and higher than a lower surface of the first pattern 16.

In another modified example, an upper surface of the isolation region 52 may be formed at a level lower than that of a lower surface of the first pattern 16.

In an example, the active region 50*b*, the first pattern 16, and the stacked line 25*b* may be sequentially stacked and may be vertically aligned. The active region 50*b*, the first pattern 16, and the stacked line 25*b* may extend in the second direction X. The second direction X may be a direction parallel to an upper surface of the substrate 5.

Figure 16:
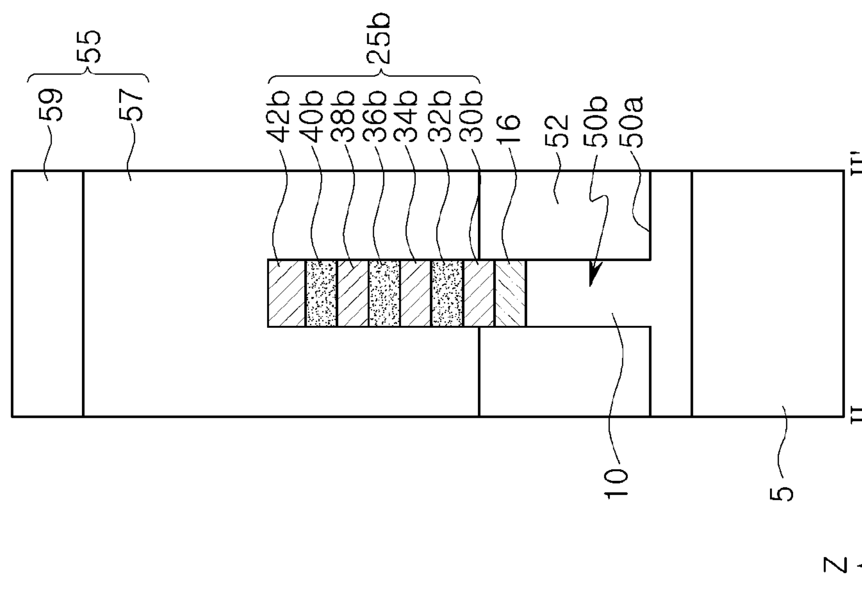
Figure 16:
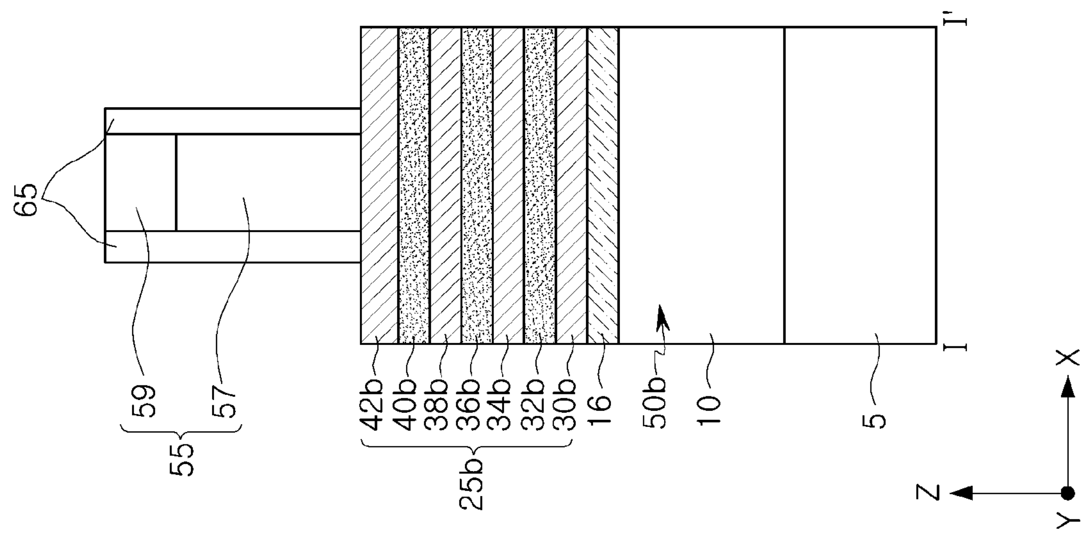

Referring to FIGS. 1 and 16, a sacrificial gate pattern 55 extending in the first direction Y, may be provided. The sacrificial gate pattern 55 may extend to the isolation region 52 while covering an upper surface of the stacked line 25*b* and side surfaces of the stacked line 25*b* in the first direction Y.

The sacrificial gate pattern 55 may include a lower sacrificial gate pattern 57 and an upper sacrificial gate pattern 59 on the lower sacrificial gate pattern 57.

As an example, the lower sacrificial gate pattern 57 may be formed of polysilicon, and the upper sacrificial gate pattern 59 may be formed of silicon nitride.

Gate spacers 65 may be formed on side surfaces of the sacrificial gate pattern 55. The gate spacers 65 may be formed of an insulating material.

Referring to FIGS. 1 and 17, the stacked line (25*b* of FIG. 16) is etched using an etching process with the sacrificial gate pattern 55 and the gate spacers 65, used as an etching mask, to form recesses 68. While the recesses 68 are formed, the stacked line (25*b* of FIG. 16) is etched to be formed as a stacked pattern 25*c*.

The second lines (30*b*, 34*b*, 38*b*, and 42*b* of FIG. 16) of the stacked line (25*b* of FIG. 16) are etched to be formed as second patterns (30*c*, 34*c*, 38*c*, and 42*c*), and the third lines (32*b*, 36*b*, and 40*b* of FIG. 16) of the stacked line (25*b* of FIG. 16) are etched to be formed as third patterns (32*c*, 36*c*, and 40*c*).

As an example, a bottom surface of the recesses 68 may be located lower than a bottom surface of a lowermost third pattern 32*c*, of the third patterns 32*c*, 36*c*, and 40*c*, and may be located higher than a bottom surface of a lowermost second pattern 30*c*, of the second patterns 30*c*, 34*c*, 38*c*, and 42*c*.

In a modified example, a bottom surface of the recesses 68 may be located higher than a bottom surface of the first pattern 16, and may be located lower than an upper surface of the first pattern 16.

In another modified example, a bottom surface of the recesses 68 may be located lower than a bottom surface of the first pattern 16.

As an example, a lowermost second pattern 30*c*, of the second patterns 30*c*, 34*c*, 38*c*, and 42*c*, may be referred to as a 'lower semiconductor layer' described previously with reference to FIG. 2, and the remaining second patterns 34*c*, 38*c*, and 42*c*, formed on the lowermost second pattern 30*c*, may be referred to as 'upper semiconductor layers' described previously with reference to FIG. 2.

Figure 18:
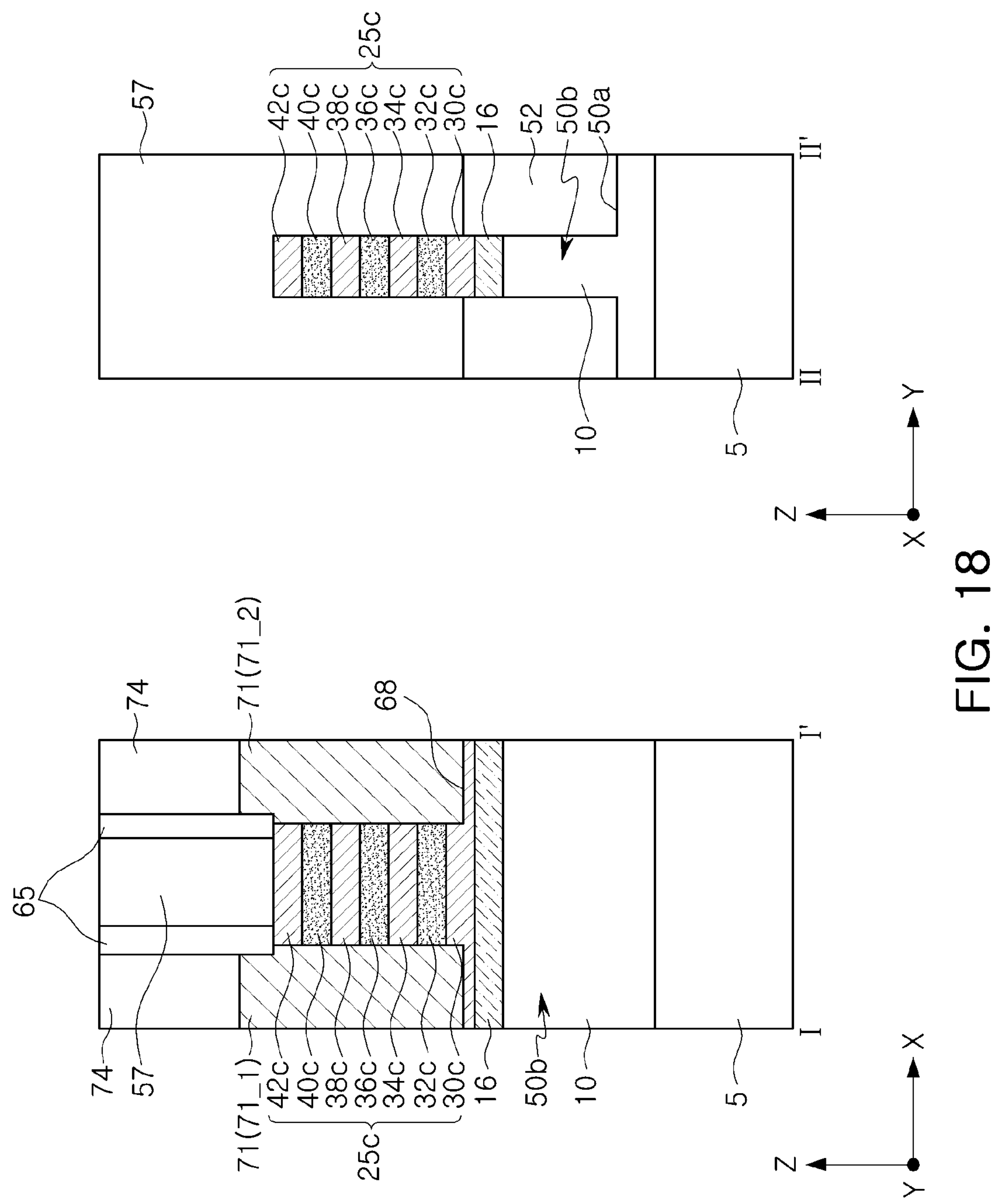

Referring to FIGS. 1 and 18, source/drain regions 71 may be formed in the recesses 68. The source/drain regions 71 may be a source/drain epitaxial material layer, grown from a surface of the stacked pattern 25*c* exposed by the recesses 68, by performing a source/drain epitaxial growth process.

The source/drain regions 71 may include an N-type source/drain impurity element or a P-type source/drain impurity element.

As an example, the source/drain regions 71 may a first source/drain region 71_1 and a second source/drain region 71_2, spaced apart from each other.

Then, an insulating layer is formed on the substrate 5 having the source/drain regions 71, and the insulating layer is planarized until the lower sacrificial gate pattern 57 is exposed to form an interlayer insulating layer 74. The interlayer insulating layer 74 may be formed on the source/drain regions 71, and may have an upper surface coplanar with an upper surface of the lower sacrificial gate pattern 57.

Figure 19:
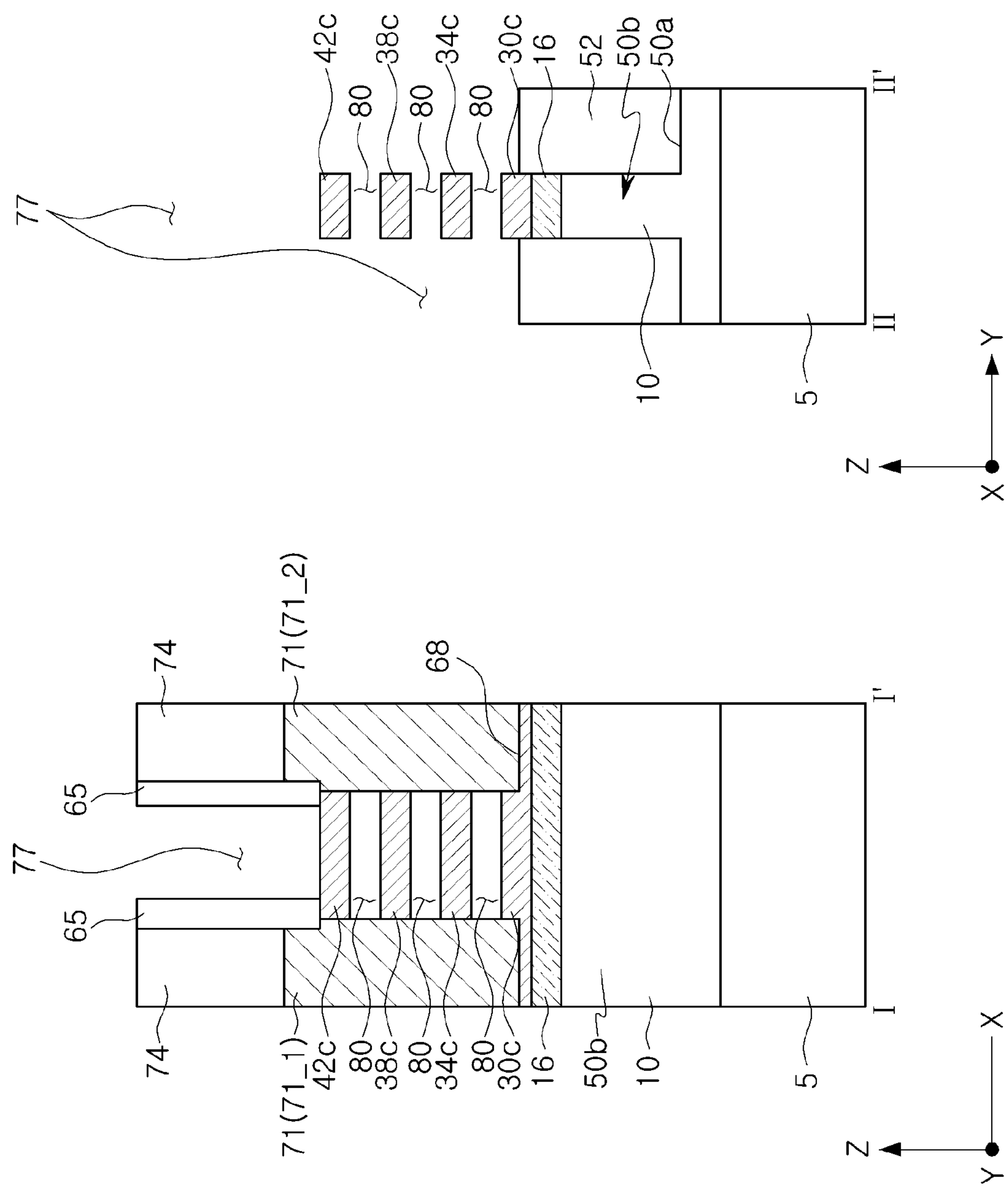

Referring to FIGS. 1 and 19, the lower sacrificial gate pattern (57 of FIG. 18) is selectively removed to form a gate trench 77. While the gate trench 77 is formed, side surfaces of the third patterns (32c, 36c, and 40c of FIG. 18) may be exposed.

After the gate trench 77 is formed, the third patterns (32c, 36c, and 40c of FIG. 18), having side surfaces exposed by the gate trench 77, are removed to form interlayer spaces 80.

As described previously, the first pattern 16 may be referred to as a 'barrier layer' described previously with reference to FIG. 2. The first pattern 16, which may be such a barrier layer, may prevent or significantly reduce diffusion of a well impurity element in the well region 10 into the second patterns 30c, 34c, 38c, and 42c as well as the third patterns 32c, 36c, and 40c, using various processes. The various processes may include epitaxial growth processes for formation of the second patterns 30c, 34c, 38c, and 42c as well as the third patterns 32c, 36c, and 40c, an epitaxial growth process for formation of the source/drain regions 71, and an annealing process for activation of source/drain impurity elements allowing the source/drain regions 71 to have N-type or P-type conductivity. As described above, a well impurity element is not diffused into the third patterns 32c, 36c, and 40c, so the third patterns (32c, 36c, and 40c of FIG. 18) may be stably and completely removed.

Again, referring to FIGS. 1 and 2, a gate structure 83, partially filling the gate trench (77 of FIG. 19) while filling the interlayer spaces (80 of FIG. 19), may be provided. The gate structure 83 may include a gate dielectric 85 and a gate electrode 87. The gate dielectric 85 may include silicon oxide and/or a high-k dielectric. The gate electrode 87 may include a conductive material.

A gate capping pattern 90 filling a remaining portion of the gate trench (77 of FIG. 19) may be formed on the gate structure 83. The gate capping pattern 90 may be formed of an insulating material such as silicon oxide and/or silicon nitride.

After the interlayer insulating layer (74 of FIG. 19), located on the source/drain regions 71, is etched, contact plugs 93 may be formed on the source/drain regions 71. The contact plugs 93 may include a first contact plug 93_1, formed on the first source/drain region 71_1, and a second contact plug 93_2, formed on the second source/drain region 71_2.

As described above with reference to certain embodiments of the inventive concept, a semiconductor device may be provided in which a barrier layer is interposed between an active region and a semiconductor layer, wherein the barrier layer prevents or significantly reduces leakage current that may otherwise occur between the semiconductor layer which may be used as a channel, and an active region. The barrier layer may prevent or significantly reduce diffusion of a well impurity region of a well region in an active region into the semiconductor layer.

While example embodiments have been shown and described above, it will be apparent to those skilled in the art that modifications and variations could be made without departing from the scope of the appended claims.

What is claimed is:

1. A semiconductor device, comprising:

a substrate;

an active region on the substrate;

an isolation region on the substrate and on side surfaces of the active region;

a first source/drain region and a second source/drain region on the active region and spaced apart from each other;

a barrier layer on and contacting the active region;

upper semiconductor layers on the barrier layer and spaced apart from each other in a vertical direction; and a gate structure covering an upper surface, a lower surface, and side surfaces of each of the upper semiconductor layers in a first direction and extending on the isolation region, wherein the vertical direction is perpendicular to an upper surface of the substrate, wherein the first direction is parallel to the upper surface of the substrate, wherein a material of the barrier layer is different from a material of the upper semiconductor layers, wherein the barrier layer and the upper semiconductor layers are between the first source/drain region and the second source/drain region, wherein the barrier layer includes a first side surface contacting the first source/drain region and a second side surface contacting the second source/drain region, wherein the barrier layer further includes a third side surface and a fourth side surface, wherein at least a portion of each of the third and fourth side surfaces of the barrier layer contacts the gate structure, and wherein a lower surface of the gate structure adjacent to the barrier layer is at a higher level than a lower surface of the barrier layer.

2. The semiconductor device of claim 1, wherein lower surfaces of the first and second source/drain regions are at a lower level than the lower surface of the barrier layer.

3. The semiconductor device of claim 1, wherein each of the third and fourth side surfaces of the barrier layer includes a first side portion contacting the gate structure and a second side portion contacting the isolation region.

4. The semiconductor device of claim 1, wherein the barrier layer includes a barrier impurity element, and wherein the upper semiconductor layers do not include the barrier impurity element.

5. The semiconductor device of claim 4, wherein the barrier impurity element includes at least one of oxygen (O) and carbon (C).

6. The semiconductor device of claim 1, wherein an upper surface of the barrier layer contacts the gate structure.

7. The semiconductor device of claim 1, further comprising:

a lower semiconductor layer between the gate structure and the barrier layer, wherein a lower surface of the lower semiconductor layer contacts the barrier layer, wherein an upper surface of the lower semiconductor layer contacts the gate structure, and wherein a material of the lower semiconductor layer is different from the material of the barrier layer.

8. The semiconductor device of claim 1, wherein the active region includes side surfaces aligned with the third and fourth side surfaces of the barrier layer.

9. The semiconductor device of claim 1, wherein a thickness of the barrier layer is different from a thickness of each of the upper semiconductor layers.

10. A semiconductor device comprising:

a substrate;

an active region on the substrate;

an isolation region on the substrate and on side surfaces of the active region;

a first source/drain region and a second source/drain region on the active region and spaced apart from each other;

a barrier layer on and contacting the active region;

upper semiconductor layers on the barrier layer and spaced apart from each other in a vertical direction; and a gate structure covering an upper surface, a lower surface, and side surfaces of each of the upper semiconductor layers in a first direction and extending on the isolation region, wherein the vertical direction is perpendicular to an upper surface of the substrate, wherein the first direction is parallel to the upper surface of the substrate, wherein a material of the barrier layer is different from a material of the upper semiconductor layers, wherein the barrier layer and the upper semiconductor layers are between the first source/drain region and the second source/drain region, wherein the barrier layer includes a first side surface contacting the first source/drain region and a second side surface contacting the second source/drain region, wherein the barrier layer further includes a third side surface and a fourth side surface, wherein at least a portion of each of the third and fourth side surfaces of the barrier layer contacts the gate structure, and wherein the barrier layer further includes a first barrier portion between the active region and the first source/drain region, and a second barrier portion between the active region and the second source/drain region.

11. The semiconductor device of claim 10, wherein a thickness of a portion of the barrier layer between the gate structure and the active region is greater than a thickness of each of the first and second barrier portions.

12. The semiconductor device of claim 10, wherein a lower surface of the gate structure adjacent to the barrier layer is at a higher level than a lower surface of the barrier layer.

13. The semiconductor device of claim 10, wherein an upper surface of the barrier layer contacts the gate structure.

14. The semiconductor device of claim 10, further comprising:

a lower semiconductor layer between the gate structure and the barrier layer, wherein a lower surface of the lower semiconductor layer contacts the barrier layer, wherein an upper surface of the lower semiconductor layer contacts the gate structure, and wherein a material of the lower semiconductor layer is different from the material of the barrier layer.

15. The semiconductor device of claim 10, wherein the active region includes side surfaces aligned with the third and fourth side surfaces of the barrier layer.

16. The semiconductor device of claim 10, wherein a thickness of the barrier layer is different from a thickness of each of the upper semiconductor layers.

17. The semiconductor device of claim 10, wherein a lower surface of the gate structure is at a lower level than a lower surface of the barrier layer.

* * * * *